United States Patent
MacLean et al.

(10) Patent No.: US 12,191,357 B2
(45) Date of Patent: Jan. 7, 2025

(54) QUANTUM CONTROL DEVICES AND METHODS

(71) Applicant: Infinite Potential Laboratories LP, Waterloo (CA)

(72) Inventors: Steve MacLean, Saint Lambert (CA); François Fillion-Gourdeau, La Prairie (CA); Pierre Louis Joseph Lévesque, Kitchener (CA); Jean-Philippe W. MacLean, Waterloo (CA)

(73) Assignee: Infinite Potential Laboratories LP, Waterloo (CA)

( * ) Notice: Subject to any disclaimer, the term of this patent is extended or adjusted under 35 U.S.C. 154(b) by 758 days.

(21) Appl. No.: 17/462,733

(22) Filed: Aug. 31, 2021

(65) Prior Publication Data

US 2023/0187503 A1 Jun. 15, 2023

Related U.S. Application Data

(63) Continuation of application No. PCT/CA2020/050291, filed on Mar. 5, 2020.
(Continued)

(51) Int. Cl.
*H01L 29/16* (2006.01)
*B82Y 10/00* (2011.01)
(Continued)

(52) U.S. Cl.
CPC ...... *H01L 29/1606* (2013.01); *H01L 29/0676* (2013.01); *H01L 29/66977* (2013.01); *B82Y 10/00* (2013.01)

(58) Field of Classification Search
CPC ........... H01L 29/66977; H01L 29/1606; H01L 29/0676; H10N 99/05
See application file for complete search history.

(56) References Cited

U.S. PATENT DOCUMENTS

| 3,755,704 A | 8/1973 | Spindt et al. |
| 8,507,894 B2 | 8/2013 | Morello et al. |
| (Continued) | | |

FOREIGN PATENT DOCUMENTS

| CN | 102339699 | 2/2012 |
| CN | 105931931 | 9/2016 |
| (Continued) | | |

OTHER PUBLICATIONS

JPO, Office Action mailed Oct. 26, 2022, in JP 2021-553761, 4 pgs.
(Continued)

*Primary Examiner* — Changhyun Yi
(74) *Attorney, Agent, or Firm* — Henry Patent Law Firm PLLC

(57) ABSTRACT

In a general aspect, a quantum control device includes a substrate having a substrate surface. An insulator layer is disposed over the substrate surface and defines a cavity. The insulator layer includes an insulator surface that defines an opening to the cavity. The quantum control device also includes a field-responsive layer over the insulator surface. The field-responsive layer includes a target region that resides over the opening to the cavity. The quantum control device additionally includes a projection extending from the substrate into the cavity and terminating at a tip. The projection is configured to produce an electric field that interacts with a quantum state in the target region. The tip resides in the cavity and configured to concentrate the electric field produced by the projection.

21 Claims, 11 Drawing Sheets

Related U.S. Application Data

(60) Provisional application No. 62/815,974, filed on Mar. 8, 2019.

(51) Int. Cl.
  *H01L 29/06* (2006.01)
  *H01L 29/66* (2006.01)

(56) References Cited

U.S. PATENT DOCUMENTS

| | | |
|---|---|---|
| 9,646,798 B2 | 5/2017 | Hyde et al. |
| 9,659,734 B2 | 5/2017 | Duncan et al. |
| 9,659,735 B2 | 5/2017 | Duncan et al. |
| 9,666,401 B2 | 5/2017 | Park et al. |
| 9,748,071 B2 | 8/2017 | Guerrera et al. |
| 2006/0099825 A1 | 5/2006 | Song et al. |
| 2010/0102298 A1 | 4/2010 | Wu |
| 2015/0027523 A1 | 1/2015 | Samuelson et al. |
| 2016/0376156 A1 | 12/2016 | Choubak et al. |

FOREIGN PATENT DOCUMENTS

| | | |
|---|---|---|
| JP | 2000286245 | 10/2000 |
| JP | 2005532181 | 10/2005 |
| JP | 2006135263 | 5/2006 |
| JP | 2010135761 | 6/2010 |
| JP | 2011512525 | 4/2011 |
| JP | 2017123078 | 7/2017 |
| KR | 1020060025999 | 3/2006 |
| WO | 20170112937 | 6/2017 |
| WO | 2018015738 | 1/2018 |

OTHER PUBLICATIONS

EPO, Extended European Search Report mailed May 2, 2022, in EP 20769343.3, 8 pgs.
Gagnon, et al., "Pulse shaping in the terahertz frequency range for the control of photo-excited carriers in graphene", arXiv:1710.09889v3, Nov. 3, 2018, 10 pgs.
JPO, Office Action issued in Application No. 2021-553761 on Apr. 20, 2023, 1 page.
WIPO, International Search Report and Written Opinion mailed Jun. 15, 2020, in PCT/CA2020/050291, 11 pgs.
Biagioni, et al., "Nanoantennas for visible and infrared radiation", Re. Prog. Phys. 75, 024402, Mar. 2011, 79 pgs.
Bimberg, "Quantum dots: promises and accomplishments", Materials Today, vol. 14, No. 9, Sep. 2011, 10 pgs.
Etchegoin, et al., "A perspective on single molecule SERS: current status and future challenges", Phys. Chem. Chem. Phys., 10, Sep. 2008, 12 pgs.
Fillion-Gourdeau, et al., "Time-domain quantum interference in graphene", Phys.Rev.B 94, 125423, Jul. 2016, 14 pgs.
Freitag, et al., "Electrostatically Confined Monolayer Graphene Quantum Dots with Orbital and Valley Splittings", Nano Letters, 17 (5), Jul. 28, 2016, 8 pgs.
Garcia, et al., "Patterning of silicon surfaces with noncontact atomic force microscopy: Field-induced formatino of nanometer-size water bridges", J. Appl. Phys. 86, 4, Aug. 15, 1999, 6 pgs.
Gault, et al., "Estimation of the tip field enhancement on a field emitter under laser illumination", Appl.Phys.Lett. 86, 094101, Feb. 2005, 4 pgs.
Guerrera, et al., "Nanofabrication of arrays of silicon field emitters with vertical silicon nanowire current limiters and self-aligned gates", Nanotechnology 27, 295302, Jun. 13, 2016, 12 pgs.
Hagenmuller, et al., "Cavity QED of the Graphene Cyclotron Transition", Dec. 2012, 6pgs.
Hao, et al., "Electromagnetic fields around silver nanoparticles and dimers", J.Chem.Phys. 120, 1, Jan. 1, 2004, 10 pgs.

Heinisch, et al., "Mie scattering analog in graphene: lensing, particle confinement, and depletion of Klein tunneling", Phys. Rev. B 87, 155409, Apr. 2013, 7 pgs.
Helfenstein, et al., "Highly collimated electron beams from double-gate field emitter arrays with large collimation gate apertures", Applied Physics Letters 98, 061502, Feb. 9, 2011, 3 pgs.
Imamoglu, et al., "Quantum information processing using quantum dot spins and cavity-QED", Phys.Rev.Lett 83, May 1999, 11 pgs.
Jiang, "Electric-field switching of two-dimensional van der Waals magnets", Nature Materials, 17(5), Mar. 2018, 13 pgs.
Kastner, "Artificial Atoms", Physics Today, Jan. 1993, 8 pgs.
Kiraz, "Cavity-quantum electrodynamics with quantum dots", J. Opt. B: Quantum Semiclass. Opt. 5, Feb. 27, 2003, 9 pgs.
Li, et al., "Hybrid plasmonic gap modes in metal film-coupled dimers and their physical origins revealed by polarization resolved dark field spectroscopy", Nanoscale, 2016, 8, Feb. 26, 2016, 8 pgs.
Li, et al., "Ultrahigh Enhancement of Electromagnetic Fields by Exciting Localized with Extended Surface Plasmons", The Journal of Physical Chemistry C 119, No. 33, Aug. 20, 2015, 11 pgs.
Loss, et al., "Quantum Computation with Quantum Dots", Phys. Rev. A 57, 1998, 21 pgs.
Mao, et al., "Realization of a Tunable Artificial Atom at a Supercritically Charged Vacancy in Graphene", Nature Physics 12, 545, Feb. 22, 2016, 36 pgs.
Moldovan, et al., "Magnetic field dependence of the atomic collapse state in graphene", IOP Publishing, 2d Mater. 6 015017, Nov. 8, 2017, 9 pgs.
Mustonen, et al., "Five picocoulomb electron bunch generation by ultrafast laser-induced field emission from metallic nano-tip arrays", Applied Physics Letters 99, 103504, Sep. 7, 2011, 4 pgs.
Petta, et al., "Coherent Manipulation of Coupled Electron Spins in Semiconductor Quantum Dots", Science 309, 2180, Sep. 30, 2005, 6 pgs.
Piot, et al., "First Operation of an Ungated Diamond Field-Emission Array Cathode in a L-Band Radiofrequency Electron Source", arXiv:1402.6999v1, Feb. 27, 2014, 5 pgs.
Pochet, et al., "Toward Moire engineering in 2D materials via dislocation theory", Applied Materials Today 9, arXiv:1709.10363, Sep. 29, 2017, 30 pgs.
Schofield, et al., "Quantum engineering at the silicon surface using dangling bonds", Nature Communication, Apr. 3, 2013, 7 pgs.
Shytov, et al., "Atomic Collapse and Quasi-Rydberg States in Graphene", Phys. Rev. Lett. 99, 246802, Aug. 7, 2007, 6 pgs.
Spindt, "A Thin-Film Field-Emission Cathode", Journal of Applied Physics 39, 3504, Feb. 1968, 3 pgs.
Sun, et al., "A Novel Application of Plasmonics: Plasmon-Driven Surface-Catalyzed Reactions", small 2012, 8, No. 18, Jul. 6, 2012, 10 pgs.
Sun, et al., "Plasmonic Gradient Effects on High Vacuum Tip-Enhanced Raman Spectroscopy", Advanced Optical Materials 2, Nov. 22, 2013, 7 pgs.
Theiss, et al., "Plasmonic mode mixing in nanoparticle dimers with nm-separations via substrate-mediated coupling", www.theNanoResearch.com, www.Springer.com/journal/12274, May 20, 2014, 17 pgs.
Tsujino, et al., "Measurement of transverse emittance and coherence of double-gate field emitter array cathodes", Nature Communications vol. 7, 13976, Dec. 23, 2016, 10 pgs.
Velasquez-Garcia, et al., "Electron Impact Ionizers", Micro- and Nano-enabled Multiplexed Scaled-down Systems, 3 pgs.
Wang, et al., "Observing Atomic Collapse Resonances in Artificial Nuclei on Graphene", Science, Mar. 2013, 17 pgs.
Wang, "Plasmon-Driven Surface Catalysis in Hybridized Plasmonic Gap modes", Scientific Reports, 4:7087, Nov. 18, 2014, 7 pgs.
Zhu, et al., "Bulk Molybdenum Spindt Field Emission Arrays", www.onecentralpress.com/functional-nanostructures, 2016, 4 pgs.
Zhu, et al., "Design, Fabrication and Characterization of Molybdenum Field Emitter Arrays (Mo-FEAs)", Micromachines, doi:10.3390/mi8050162, May 18, 2017, 7 pgs.
JPO, Decision to Grant issued in Application No. 2021-553761 on Oct. 2, 2023, 2 pages.
CIPO, Examiner's Requisition mailed Dec. 14, 2022, in CA 3,131,807, 4 pgs.

QUANTUM CONTROL DEVICES AND METHODS

CROSS-REFERENCE TO RELATED APPLICATIONS

This application is a continuation of PCT/CA2020/050291, filed Mar. 5, 2020, which claims priority to U.S. Provisional Patent Application No. 62/815,974, filed Mar. 8, 2019, the disclosure of which is hereby incorporated by reference.

BACKGROUND

The following description relates to quantum control devices and methods for operating quantum control devices.

Electric fields can be applied to materials to produce useful devices. For example, an electric field can be applied to a ferroelectric material to produce a capacitor that is able to store electrical energy. In another example, an electrical field can be applied to a piezo-electric material to produce an actuator that is capable of displacing an object. At present, electrical fields are used primarily in devices that are based on the classical properties of materials. These classical properties may result properties of the materials that emerge at macroscopic scale lengths (e.g., greater than 10 µm). The ability of electric fields to interact with quantum properties of materials, however, may bring about new types of useful devices.

DETAILED DESCRIPTION

In some aspects of what is described here, quantum control devices are presented for interacting with quantum states using an electric field. In particular, a quantum control device may include a substrate having a substrate surface. An insulator layer is disposed over the substrate surface and defines a cavity. The insulator layer includes an insulator surface that defines an opening to the cavity. The quantum control device also includes a field-responsive layer over the insulator surface. The field-responsive layer includes a target region that resides over the opening to the cavity. The quantum control device additionally includes a projection extending from the substrate into the cavity and terminating at a tip. The projection is configured to produce an electric field that interacts with a quantum state in the target region. The tip resides in the cavity and is configured to concentrate the electric field produced by the projection.

In some aspects of what is described here, a quantum control device may include a substrate and an insulator layer that defines an array of cavities. A field-responsive layer is disposed over the insulator layer and includes an array of target regions, each aligned with a corresponding cavity. The quantum control device may also include a projection extending from the substrate into a respective cavity. The projection is configured to produce an electric field that: [1] interacts with a quantum state of a target region adjacent the projection, and [2] controls quantum coupling between the quantum state of the target region and a quantum state of a neighboring target region. The array of projections may allow the quantum control device to correlate the quantum states of each target region, thereby establishing one or more collective quantum states.

Figure 1A:
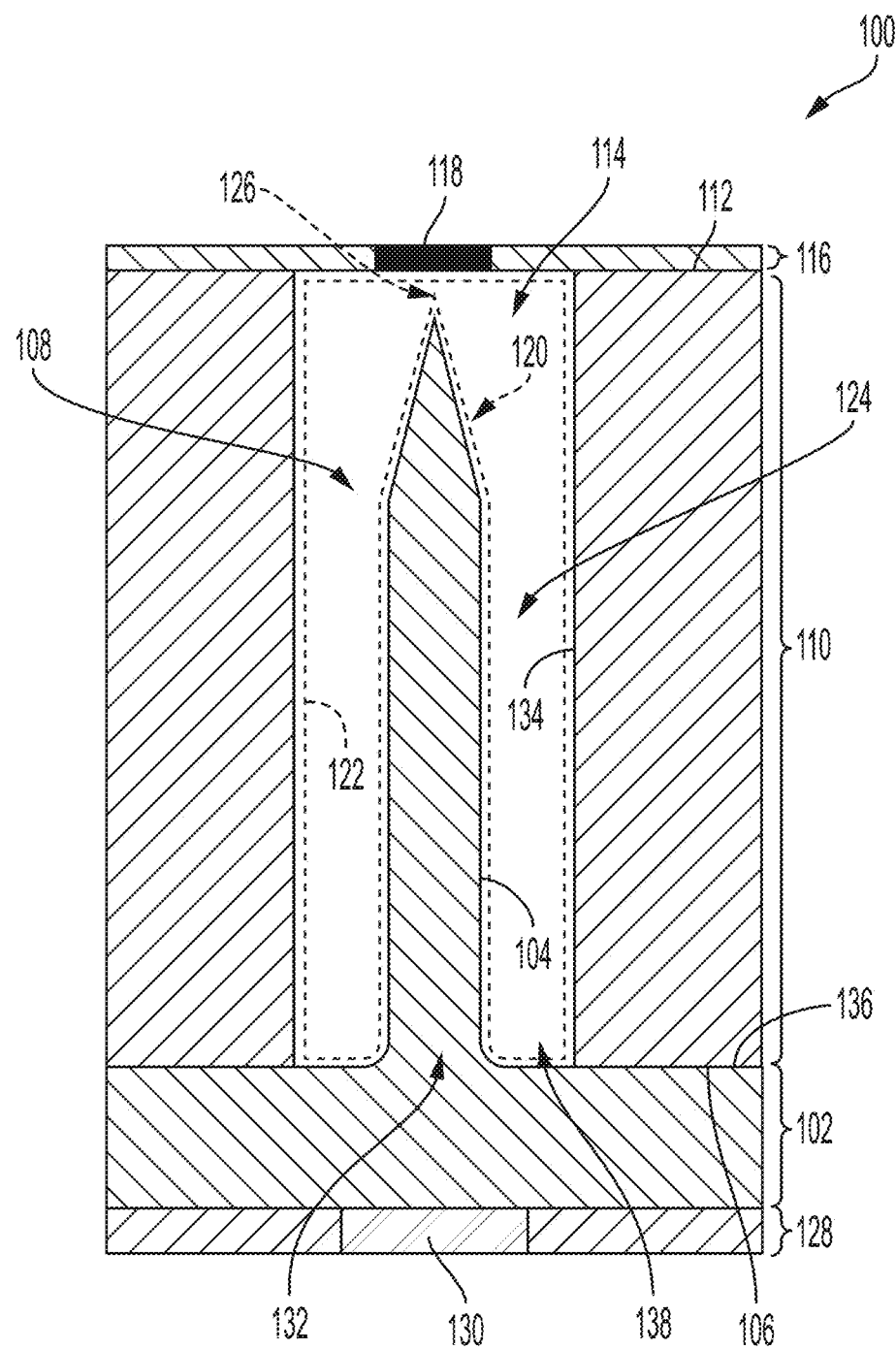
FIG. 1A is a schematic diagram of an example quantum control device having a substrate and a projection.

Now referring to FIG. 1A, a schematic diagram is presented, in cross-section, of an example quantum control device 100 having a substrate 102 and a projection 104 extending therefrom. The substrate 102 includes a substrate surface 106, which may be a planar surface, as shown in FIG. 1A. The substrate 102 may be formed of a semiconductor material such as silicon, germanium, a silicon-germanium alloy, and gallium arsenide. Other materials, however, are possible (e.g., insulator or metallic materials). The projection 104 extends from the substrate surface 106 into a cavity 108 and may define a pillar-shaped structure. However, other shapes are possible (e.g., pyramidal, hemispherical, wedge-shaped, etc.). The projection 104 may be part of the substrate 102, as shown in FIG. 1A, or alternatively, be a separate structure coupled to the substrate 102. The projection 104 may be formed of the same material as the substrate 102 or formed of a material different than the substrate 102. For example, the projection 104 may be formed of a metallic material (e.g., Mo, W, Cu, etc.), a semiconductor material (e.g., Si, Ge, Si—Ge alloy, GaN, GaAs, etc.), a carbonaceous material (e.g., diamond, carbon nanotubes, carbon nanorods, etc.), or a ceramic material (e.g., hexagonal boron nitride, metallic oxides, etc.). Other materials are possible.

The example quantum control device 100 includes an insulator layer 110 disposed over the substrate surface 106 and defining the cavity 108. The insulator layer 110 includes an insulator surface 112 that defines an opening 114 to the cavity 108. The insulator surface 112 may be a planar surface and may also be parallel to the substrate surface 106. The insulator layer 110 may be in contact with the substrate surface 106, such as shown in FIG. 1A, or alternatively, be coupled to the substrate 102 through one or more intermediate layers. Such intermediate layers may improve a coupling of the insulator layer 110 to the substrate 102.

In some implementations, the cavity 108 is disposed entirely through the insulator layer 110. In these implementations, the cavity 108 may be defined by a longitudinal axis and a cross-sectional area. The longitudinal axis may be straight, curved, or some combination thereof. The cross-sectional area may be bounded by any type of perimeter (e.g., a circle, a hexagon, an oblong, a parallelogram, etc.). The cross-sectional area may also remain constant along the longitudinal axis or vary with distance through the insulator layer 110. For example, the cavity 108 may be a cylindrical cavity that is defined by a straight longitudinal axis and a circular cross-sectional area of constant radius. In another example, the cavity 108 may have a frustrum shape that is defined by a straight longitudinal axis and a cross-sectional area that decreases in size with distance from the insulator surface 112. Other shapes for the cavity 108 are possible.

In some implementations, the insulator layer 110 is formed of a material having an electrical resistivity equal to or greater than $1\times10^8$ Ω·cm. Examples of such materials include aluminum oxide (e.g., $Al_2O_3$), silicon oxide (e.g., $SiO_2$, $SiO_x$, etc.), silicon nitride (e.g., $Si_3N_4$), silicon oxynitride (e.g., $SiO_xN_y$), hafnium oxide (e.g., $HfO_2$), titanium nitride (e.g., TiN) and so forth. In some implementations, the material has an electrical resistivity equal to or greater than $1\times10^{10}$ Ω·cm at room temperature. In some implementations, the material has an electrical resistivity equal to or greater than $1\times10^{12}$ Ω·cm at room temperature. In some implementations the material has an electrical resistivity equal to or greater than $1\times10^{14}$ Ω·cm at room temperature.

The example quantum control device 100 also includes a field-responsive layer 116 disposed over the insulator surface 112 and including a target region 118. The target region 118 resides over the opening 114 to the cavity 108, which may be at a position centered over the opening 114 and opposite the projection 104. However, other positions of the target region 118 are possible (e.g., off-center, offset relative to the projection 104, etc.) In some instances, the field-responsive layer 116 is a patterned layer, which may be formed of two or more materials. In some instances, the field-responsive layer 116 includes a plurality of layers. The plurality of layers may include a ferromagnetic layer, and antiferromagnetic layer, a superconducting layer, or any combination thereof. Other types of layers are possible. Moreover, the plurality of layers may define a sandwiched structure having one or more of a ferromagnetic layer, an antiferromagnetic layer, and a superconducting layer sandwiched between other layers (e.g., ferromagnetic layers, antiferromagnetic layers, superconducting layers, etc.).

The field-responsive layer 116 may have one or more quantum states associated with the target region 118 that change in response to the electric field. Examples of the one or more quantum states include those based on an electronic band structure, an electronic spin, a nuclear spin, a magnetic ordering, a magnetic moment, a ferroelectric ordering, a ferroelectric moment, an atomic ordering, an optical transition, a phonon dispersion, one or more discrete energy levels, and so forth. Other types of quantum states are possible, including those based on a superposition of quantum states and an entanglement of quantum states.

The target region 118 may include a feature in the atomic structure of the field-responsive layer 116 that allows the one or more quantum states to emerge within the target region 118, enhances an interaction between the one or more quantum states and the electric field, or both. The atomic structure may be a two-dimensional atomic structure, a three-dimensional atomic structure, an amorphous atomic structure, or some combination thereof. For example, the field-responsive layer 116 may include a layer of graphene, which corresponds to a two-dimensional atomic structure. Examples of other two-dimensional atomic structures include a layer of hexagonal boron nitride (e.g., h-BN), a layer of molybdenum sulfide (e.g., $MoS_2$), and a layer of tungsten sulfide (e.g., $WS_2$). In another example, the field-responsive layer 116 may include a three-dimensional island formed of diamond, such as on an exterior or interior surface of the field-responsive layer 116. The three-dimensional island may also be partially or wholly embedded within the field responsive layer. In yet another example, the field-responsive layer 116 may include a nanoparticle formed of metallic glass (e.g., gold, silver, an amorphous alloy of iron and boron). The metallic glass may have a magnetic moment.

In some implementations, the target region 118 includes an inclusion in the atomic structure of the field-responsive layer 116. The inclusion may result from an atom (or group of atoms) occupying an interstitial space in the atomic structure. In some implementations, the target region 118 includes a substitution in the atomic structure of the field-responsive layer 116. The substitution may result from a chemical or isotopic substitution of one or more atoms for others in the atomic structure. In some implementations, the target region 118 includes a vacancy in the atomic structure of the field-responsive layer 116.

In some implementations, the target region 118 includes an atom or molecule on a surface of the field-responsive layer 116. The atom or molecule may include a plurality of atoms or molecules, and as such, may be an individual atom, a cluster of atoms, a chemical functional group, a nanoparticle, one or more molecules, a two-dimensional island of atoms or molecules, a stacked heterostructure based on an ordered arrangement of atom, a patterned overlayer of atoms, and so forth. The atom or molecule may be disposed on an exterior surface, of the field-responsive layer 116. The atom or molecule may also be disposed on an interior surface of the field-responsive layer 116. In some instances, both the exterior surface and the interior surface of the field-responsive layer 116 have an atom or molecule disposed thereon.

The example quantum control device 100 additionally includes the projection 104, which terminates at a tip 120. In some variations, multiple instances of the projection 104 may extend from the substrate 102 into the cavity 108 (i.e., a plurality of projections 104). The projection 104 may have a height-to-width ratio in a range of 2:1 to 10000:1. In some instances, the projection 104 may have a height-to-width ratio in a range of 20:1 to 200:1. The projection 104 is configured to produce an electric field that interacts with a quantum state in the target region 118. The tip 120 resides in the cavity 108 and is configured to concentrate the electric field produced by the projection 104. In some instances, the tip 120 is configured to concentrate the electric field to a magnitude of at least $1\times10^5$ V/m in the target region 118. In some instances, the tip 120 is configured to concentrate the electric field to a magnitude of at least $1\times10^9$ V/m in the target region 118. In some instances, the tip 120 is configured to concentrate the electric field to a magnitude of at least $1\times10^{10}$ V/m in the target region 118. In some instances, the tip 120 is configured to concentrate the electric field to a magnitude of at least $1\times10^{11}$ V/m in the target region 118. In some instances, the tip 120 is configured to concentrate the electric field to a magnitude of at least $1\times10^{12}$ V/m in the target region 118.

Concentration of the electric field may be aided by a shape of the tip 120 and a placement of the tip 120 relative to the target region 118. For example, the tip 120 may have a conical shape whose narrowing taper allows the electric field to emanate from a substantially reduced surface. The tip 120 may also include one or both of a textured surface and a nanoparticle to help concentrate the electric field. The tip 120 may additionally include a substructure, such as a grating coupler, to help concentrate the electric field. In another example, the tip 120 may reside in the cavity 108 less than 100 nm from the target region 118. Such placement may allow the target region 118 to experience a high of electric field (e.g., a magnitude at least $1\times10^5$ V/m). In some instances, the tip 120 resides in the cavity 108 less than 20 nm from the target region 118. In some instances, the tip 120 resides in the cavity 108 less than 15 nm from the target region 118. In some instances, the tip 120 resides in the cavity 108 less than 10 nm from the target region 118. In some instances, the tip 120 resides in the cavity 108 less than 5 nm from the target region 118. In some instances, the tip 120 resides in the cavity 108 less than 1 nm from the target region 118.

In some implementations, the projection 104 is formed of a material resistant to electron emission under high electric fields (or strong applied voltages). For example, the projection 104 may be formed of a material having a work function of at least 4.0 eV. Examples of such materials include semiconductor materials (e.g., Si, Ge, and Si—Ge alloys), metallic materials (e.g., Mo, W, and Cu), ceramic materials (e.g., h-BN, $WO_x$, and $MoO_x$), and carbonaceous materials (e.g., diamond, carbon nanotubes, and carbon nanorods). In some instances, the projection 104 is formed of a material having a work function of at least 4.2 eV. In some instances, the projection 104 is formed of a material having a work function of at least 4.4 eV. In some instances, the projection 104 is formed of a material having a work function of at least 4.6 eV. In some instances, the projection 104 is formed of a material having a work function of at least 4.8 eV. In some instances, the projection 104 is formed of a material having a work function of at least 5.0 eV.

When formed of a semiconductor material, the projection 104 may include a doping profile that defines a spatial distribution of p-type dopants, n-type dopants, or both, within the projection 104. The spatial distribution may be simple (e.g., a uniform distribution) or complex (e.g., a distribution establishing one or more p-n junctions along the projection 104). In some instances, the projection 104 is formed of a conductive material. The conductive material may have an electrical resistivity less than 100 Ω·cm at room temperature. For example, the conductive material may be a doped silicon material having a room-temperature electrical resistivity in the range of 2-50 Ω·cm. In further instances, the conductive material may have an electrical resistivity less than $1\times10^{-1}$ Ω·cm. In some variations, the projection 104 is formed of a material that becomes conductive when activated (e.g., when a voltage is applied to the projection 104). The material may transition to an electrical resistivity below 100 Ω·cm when activated. In some instances, the projection 104 may include a coated outer surface. For example, the projection 104 may be formed of a first material (e.g. Si) and coated with a second material (e.g., Pt) having a higher work function than the first material. In some variations, the second material may be a superconducting material.

In some implementations, the substrate 102, the insulator layer 110, and the field-responsive layer 116 define an enclosed space 122 in the cavity 108 (e.g., see dashed line in FIG. 1A). The enclosed space 122 includes a first clearance volume 124 between the projection and the insulator layer. The first clearance volume 124 may include a volume between a side of the projection 104 and a side wall of the cavity 108. In some instances, the enclosed space 122 may also include a second clearance volume 126 between the projection 104 and the field-responsive layer 116. The second clearance volume 126 may include a volume between a tip 120 of the projection 104 and an interior surface of the field-responsive layer 116. The enclosed space 122 is operable to electrically isolate the projection 104 from the insulator layer 110. The enclosed space 122 may also assist the insulator layer 110 in electrically-isolating the projection 104 from other projections in respective cavities of the insulator layer 110 (e.g., if the quantum control device is part of an array of quantum control devices).

Figure 1B:
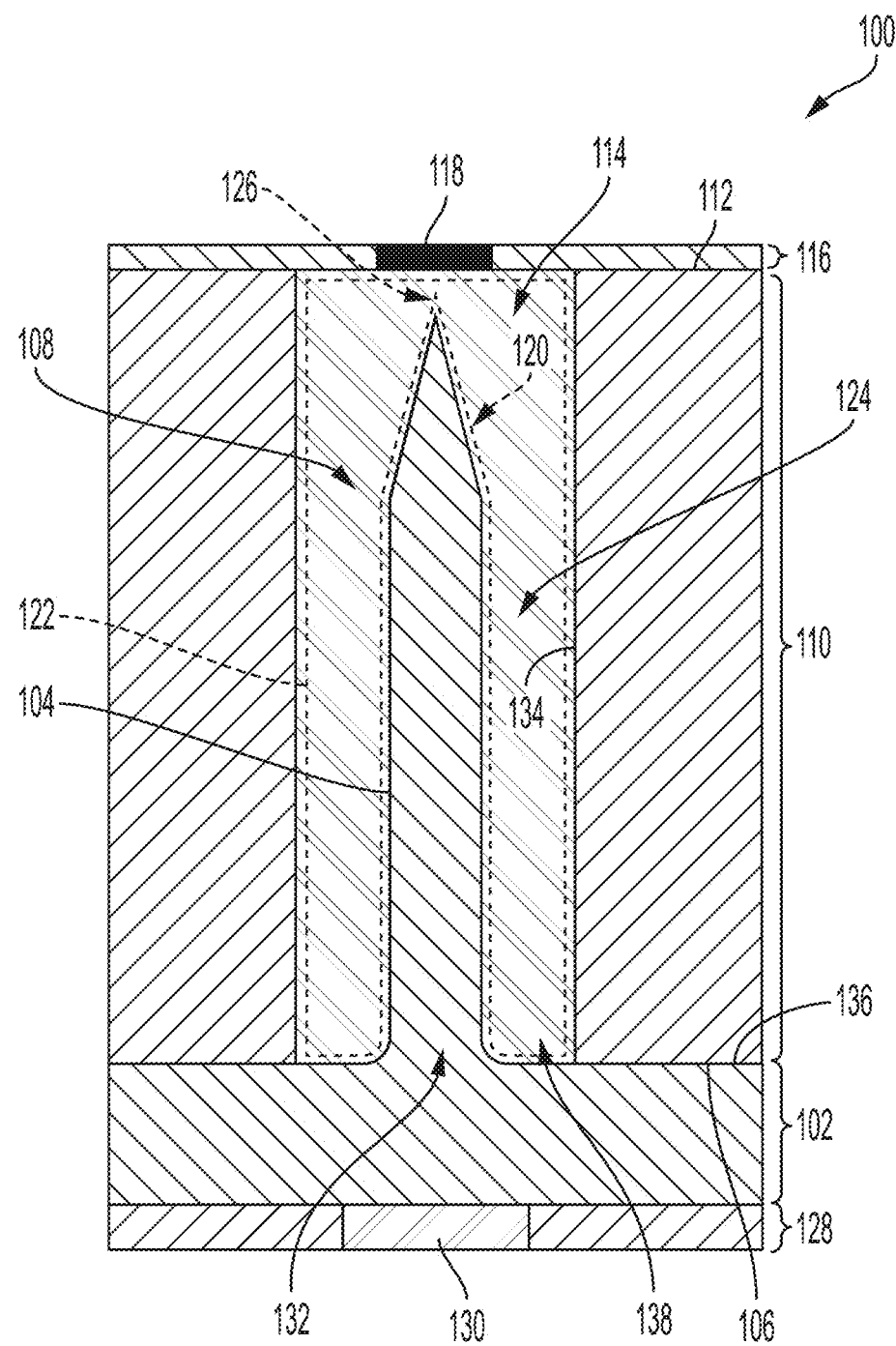
FIG. 1B is a schematic diagram of the example quantum control device of FIG. 1A, but in which an enclosed space is entirely filled by dielectric material.

The enclosed space 122 may include a vacuum in any portion thereof, including an entire portion. In some instances, the enclosed space 122 contains a vacuum pressure no greater than $10^{-5}$ Torr. In some instances, the enclosed space 122 contains a vacuum pressure no greater than $10^{-8}$ Torr. The enclosed space 122 may also be filled at least partially with a dielectric material. Such filling may partition the enclosed space 122 into one or more internal chambers, or alternatively, filled the enclosed space 122 entirely. FIG. 1B presents a schematic diagram of the example quantum control device 100 of FIG. 1A, but in which the enclosed space 122 is entirely filled by dielectric material. The dielectric material may be a material having a dielectric constant ranging from 1 to 10. In some instances, the dielectric material has a dielectric constant greater than 10. In some instances, the dielectric material has a dielectric constant greater than 100. The dielectric material may also have a dielectric strength greater than 0.05 V/nm, and in many variations, greater than 1 V/nm. Examples of such materials include silicon oxide (e.g., $SiO_2$), silicon nitride (e.g., $Si_3N_4$), boron nitride (e.g. h-BN), and diamond. In some instances, the dielectric material may be formed of the same material as the insulator layer 110.

In some implementations, the insulator layer 110 includes an interior sidewall 134 surrounding the projection 104 that defines at least a portion of the cavity 108. The interior sidewall 134 may meet the insulator surface 112 at the opening 114 to the cavity 108. In some instances, the interior sidewall 134 is displaced from the projection 104 to create a gap (e.g., see FIGS. 1A-1C). The gap may contribute to the first clearance volume 124 of the projection 104. In some instances, the interior sidewall 134 may contact the projection 104 along at least a portion of a surface of the projection 104. Such contact may embed the projection 104 within the insulator layer 110.

In further implementations, the opening 114 is a first opening 114 of the cavity 108 and the insulator surface 112 is a first insulator surface 112 of the insulator layer 110. The insulator layer 110 includes a second insulator surface 136 coupled to the substrate surface 106 and opposite the first insulator surface 112. Such coupling may include direct contact between the second insulator surface 136 and the substrate surface 106, or alternatively, occur through one or more intermediate layers. The one or more intermediate layers may improve a coupling of the insulator layer 110 to the substrate 102. In some instances, the substrate surface 106, the first insulator surface 112 and the second insulator surface 136 are planar surfaces. In these embodiments, the interior sidewall 134 extends through a thickness of the insulator layer 110 and meets the second insulator surface 136 at a second opening 138 of the cavity 108. The projection 104 extends from the substrate 102 through the second opening 138 of the cavity 108 and extends to a height from the substrate 102 that is less than the thickness of the insulator layer 110.

The example quantum control device 100 may include an addressing layer 128 below the substrate 102 that includes an electrical contact 130 opposite a base 132 of the projection 104. The addressing layer 128 may be in contact with the substrate 102, such as shown in FIG. 1A, or alternatively, be coupled to the substrate 102 through one or more intermediate layers. Such intermediate layers may improve a coupling of the addressing layer 128 to the substrate 102. The electrical contact 130 may be configured to deliver a voltage to the substrate 102. The electrical contact 130 may also be configured to receive an electrical signal from the substrate 102 that represents a quantum state of the target region 118. In this capacity, the electrical contact 130 may be used to characterize a quantum state of the target region 118.

In implementations having the addressing layer 128, the substrate 102 may be configured to transfer the voltage to the projection 104 to produce the electric field and transfer the electrical signal from the projection 104 to the electrical contact 130. A voltage potential of the substrate 102 may be controlled independently of a voltage potential of the tip 120 of the projection 104. Such independent control may be assisted by the addressing layer 128 and the electrical contact 130.

In operation, the example quantum control device 100 experiences a voltage potential between the substrate 102 (or electrical contact 130, if present) and the field-responsive layer 116 (or a layer above). In particular, a voltage may be applied to the substrate 102 (or electrical contact 130), which then transfers to the projection 104 to establish the voltage potential. The voltage may be applied continuously or through voltage pulses. The voltage pulses may have a time duration less than or equal to 1 millisecond. In some instances, the time duration is less than or equal to 1 picosecond. In some instances, the time duration is less than or equal to 100 femtoseconds (e.g., 10-40 femtoseconds).

The voltage may be supplemented by a laser to establish the voltage potential. For example, the laser may generate a coherent beam of electromagnetic radiation that is received by the target region 118, the projection 104 (or multiple instances thereof), or both. Upon receipt, an electric field component of the coherent beam of electromagnetic radiation may alter the voltage potential (e.g., increase the voltage potential) between the projection 104 (or multiple instances thereof) and the target region 118. The voltage potential may include pulses having a time duration. In some instances, the time duration of the pulses is less than or equal to 1 picosecond. In some instances, the time duration of the pulses is less than or equal to 100 femtoseconds (e.g., 10-40 femtoseconds).

In response, the electric field is generated, during which, the electric field extends from the tip 120 of the projection 104 to penetrate the target region 118. The tip 120 functions, in part, to concentrate the electric field to high magnitudes, and as such, the target region 118 may receive the electric field at a magnitude of at least $1 \times 10^5$ V/m. In many instances, the magnitude is greater than $1 \times 10^9$ V/m. Upon receiving the electric field, the one or more quantum states of the target region 118 may emerge or be altered in characteristic (e.g., altered in number, occupancy, spin, energy, size, spatial distribution, coupling to other quantum states, etc.). In this manner, the voltage potential may allow manipulation of the one or more quantum states of the target region 118, and in some instances, may also allow manipulation of quantum states of the field-responsive layer 116.

Control of the electric field—such as by altering a magnitude or frequency of the voltage, or by applying voltage pulses—may allow for interaction with the one or more quantum states. Such interaction may change a property of the target region 118 (or field-responsive layer 116) and allow for storing and manipulating information represented by the one or more quantum states. Examples of such properties include an optical property (e.g., an optical transmission, an optical reflection, an optical emission, a polarization, a phase, etc.), a magnetic property (e.g., a magnetic moment, a magnetic ordering, an inductance, etc.), a thermal property (e.g., a specific heat, a thermal conductance, etc.), an electrical property (e.g., a resistivity, a capacitance, etc.), and combinations thereof (e.g., an optoelectronic effect, a magnetocaloric effect, etc.). Other properties are possible, such quantum properties based on a correlation of two or more quantum states.

In some implementations, control of the electric field may establish an electrostatic potential well in the target region 118 that results in the one or more quantum states each having a plurality of discrete energy levels. The plurality of discrete energy levels may be manipulated by the electric field to induce the target region 118 to function as an artificial atom. In this capacity, the target region 118 may include a discrete number of electrons that populate a corresponding discrete spectrum of energy levels. As such, the target region 118 may operate analogously to an atom having an effective nuclear charge controlled by the electric field. Such operation may be allowed, controlled, or enhanced by a quantum system on the surface of the target region 118, or alternatively, embedded in the target region 118 (e.g., an inclusion). The quantum system may include an individual atom, a cluster of atoms, a chemical functional group, a nanoparticle, one or more molecules, a two-dimensional island of atoms or molecules, a stacked heterostructure based on an ordered arrangement of atoms, a patterned overlayer of atoms, and so forth. In some instances, the electric field may induce the target region 118 to operate as a Rydberg atom. In these instances, one or more of electrons of the target region 118 may be excited to high energies, creating an artificial atom that has a high principal quantum number.

In some implementations, control of the electric field may be used to manipulate a quantum system on the surface of the target region 118 (e.g., control a position, change an order or configuration, alter a quantum state, etc.). The quantum system may include an individual atom, a cluster of atoms, a chemical functional group, a nanoparticle, one or more molecules, a two-dimensional island of atoms or molecules, a stacked heterostructure based on an ordered arrangement of atoms, a patterned over layer of atoms, and so forth. The quantum system may have quantum states, each having a plurality of discrete energy levels. Moreover, the target region 118 may include a discrete number of electrons that populate a corresponding discrete spectrum of energy levels associated with the quantum system. In these instances, one or more of electrons of the target region 118 may be excited to high energies, creating an atom (or artificial atom) that has a high principal quantum number. In some instances, the quantum system includes a Rydberg atom (e.g., an ionized Cs atom), molecules with Rydberg-like states (e.g., homopolar diatomic molecules such as $H_2$, $P_2$, $Cl_2$, acetylene, etc.), or matter with Rydberg-like states on the surface of the target region 118.

Figure 1C:
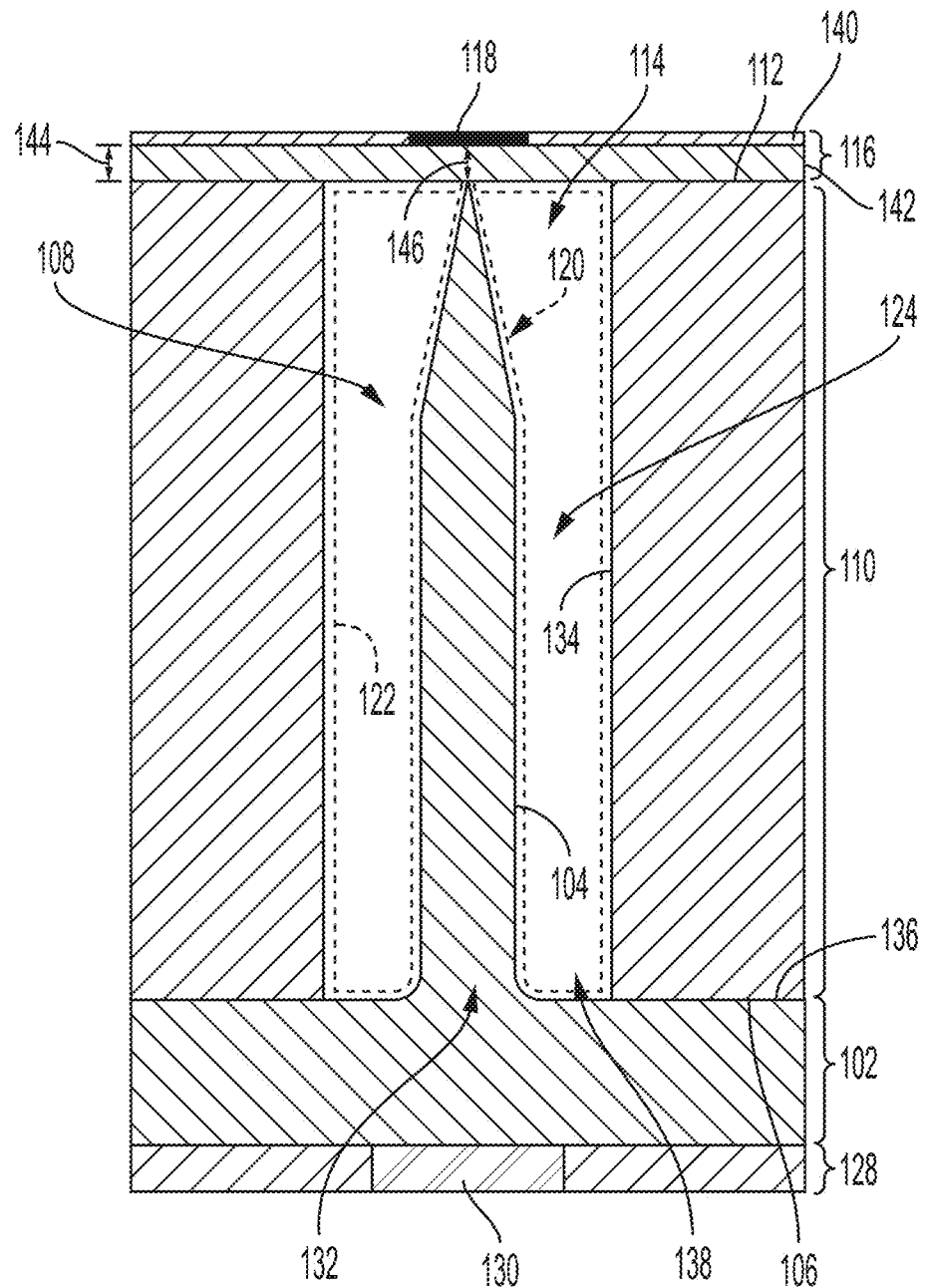
FIG. 1C is a schematic diagram of the example quantum control device of FIG. 1A, but in which a field-responsive layer includes a target layer and an intermediate layer.

In some implementations, the field-responsive layer 116 includes a plurality of layers that comprises a target layer 140 and an intermediate layer 142, as shown in FIG. 1C. The target layer 140 contains the target region 118 and the intermediate layer 142 is disposed between the insulator layer 110 and the target layer 140. A thickness 144 of the intermediate layer 142 is part of a distance 146 between the tip 120 of the projection 104 and the target region 118 of the field-responsive layer 116. The distance 146 may be less than 100 nm. In some instances, the distance 146 is less than 20 nm from the target region 118. In some instances, the distance 146 is less than 15 nm from the target region 118. In some instances, the distance 146 is less than 10 nm from the target region 118. In some instances, the distance 146 is less than 5 nm from the target region 118. In some instances, the distance 146 is less than 1 nm from the target region 118.

In some implementations, the insulator layer 110 includes a first insulator layer over the substrate surface 106 and a second insulator layer between the first insulator layer and the field-responsive layer 116. In some implementations, the example quantum control device 100 includes a second insulator layer over the field-responsive layer 116. The second insulator layer may include a hole opposite the opening 114 of the cavity 108. In further implementations, the example quantum control device 100 includes a conductive layer over the second insulator layer. The hole of the second insulator layer may propagate through the conductive layer.

The example quantum control device 100 may utilize optical stimulation of the projection 104 to generate, or assist in generating, the electric field. In some implementations, the substrate surface 106 is a first substrate surface and the substrate 102 includes a second substrate surface opposite the first substrate surface. The first substrate surface, the second substrate surface, and the insulator surface (or first insulator surface) are planar surfaces. The substrate also includes an optical focusing structure formed on the second substrate surface opposite the base 132 of the projection 104. The optical focusing structure is configured to guide light to the projection 104. Examples of the optical focusing structure include a diffractive pattern formed on the second substrate and a lens formed on the substrate surface. These structures may be defined by the second substrate surface, or alternatively, be defined by a distinct structure coupled to the second substrate surface.

The example quantum control device 100 may also utilize optical stimulation of the target region 118 to assist the projection 104 in generating the electric field. In some implementations, the target region 118 of the field-responsive layer 116 includes a nanoparticle disposed thereon. The nanoparticle may be operable to enhance an electric-field component associated with a beam of light (e.g., laser light) that impinges upon the target region 118. The enhanced electric-field component may add to a magnitude of the electric field generated by the projection 104. The nanoparticle may be disposed on an interior surface or an exterior surface of the field-responsive layer 116. In some instances, the target region 118 is embedded within the field-responsive layer 116 along with the nanoparticle. In these instances, the nanoparticle and target region 118 may define an inclusion in the field-responsive layer 116.

In some implementations, the example quantum control device 100 includes a laser configured to direct a beam of light onto the target region 118. The beam of light may include one or more types of laser beams. The beam of light may also include one or more frequencies of electromagnetic radiation (e.g., frequencies of ultraviolet light). The laser may be operable to eject one or more electrons from the target region 118 by processes of photoemission. The example quantum control device 100 also includes an electron spectrometer configured to receive electrons emitted from the target region 118 in response to receiving the beam of light. The electron spectrometer may be able to determine characteristics of the one or more quantum states of the target region 118 by measuring properties of the electrons (e.g., an energy of the electrons). In further implementations, the example quantum control device 100 may include an optical spectrometer configured to determine characteristics of one or more quantum states of the target region 118 by measuring properties of photons.

In some implementations, the example quantum control device 100 is configured to operate in a cryogenic environment. For example, the example quantum control device 100 may be disposed within a cryostat. The cryogenic environment may have any temperature below about 123 K (e.g., 77 K, 4 K, less than 1 K, etc.). In some implementations, the example quantum control device 100 is configured to operate in a vacuum environment. For example, the example quantum control device 100 may be disposed in a sealable vacuum chamber coupled to one or more vacuum pumps (e.g., rotary vane pumps, turbomolecular pumps, cryogenic pumps, etc.). The vacuum environment may be any partial pressure of gas below $10^{-1}$ torr (e.g., $10^{-3}$ torr, $10^{-6}$ torr, $10^{-9}$ torr, etc.). In some implementations, the example quantum control device 100 is configured to operate in a magnetic field (i.e., B). For example, the example quantum control device may be disposed in a magnetic field of a superconducting coil. The magnetic field may be an applied magnetic field greater than 10 mT. In some variations, the applied magnetic field is greater than 100 mT (e.g., 300 mT). In some variations, the applied magnetic field is greater than 500 mT (e.g., 1 T, 3 T, 4 T, etc.).

Figure 2A:
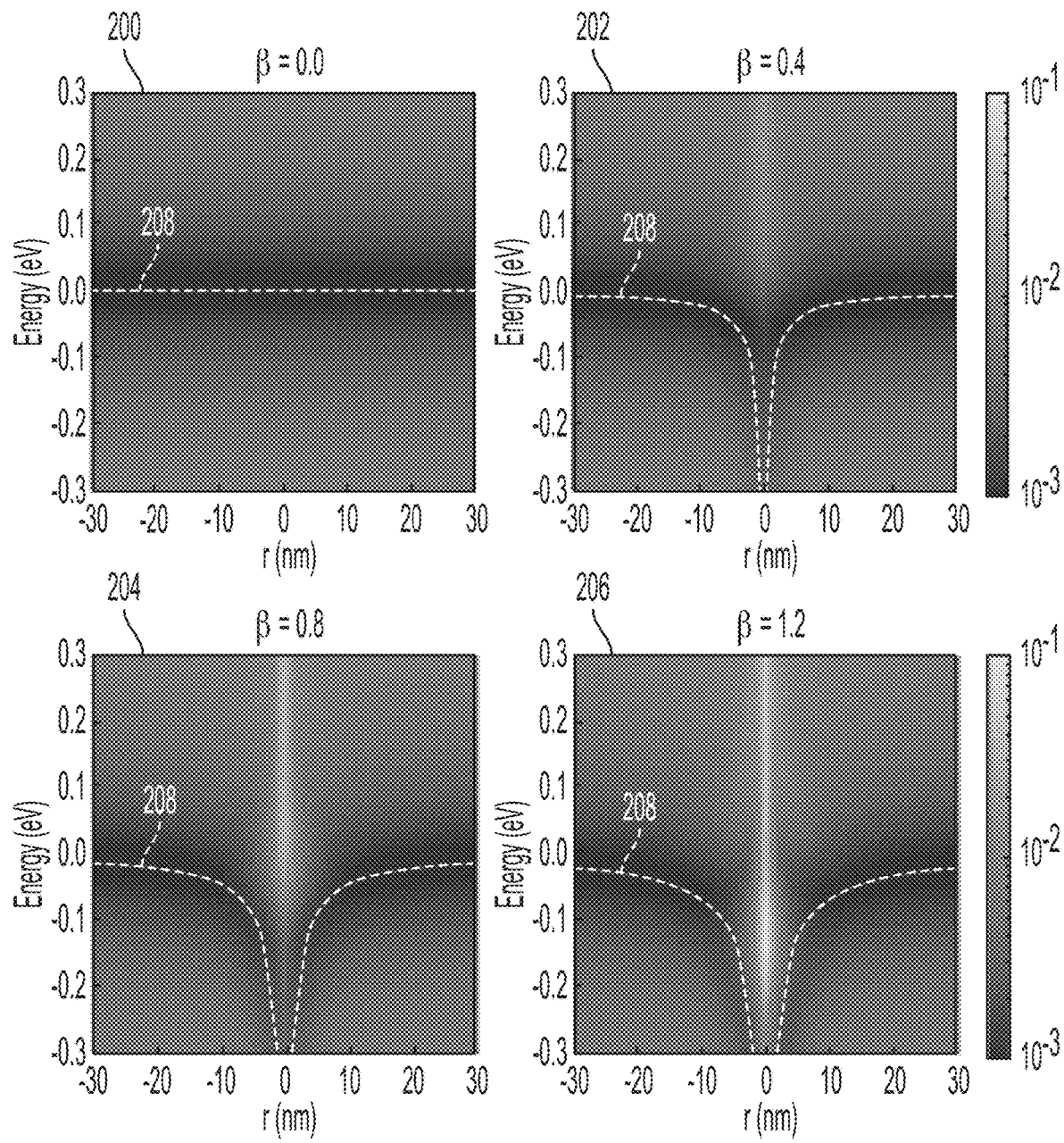
FIG. 2A presents four contour plots showing the simulated influence of an electric field on an example 200-nm graphene flake having armchair boundaries.

FIG. 2A presents four contour plots 200, 202, 204, 206 showing the simulated influence of an electric field on an example 200-nm graphene flake having armchair boundaries. The four contour plots are generated from a computer simulation of the electric field on the example 200-nm graphene flake using a Pybinding library. A density of states of the example 200-nm graphene flake is shown to respond to the electric field, which increases sequentially from contour plot 200 to contour plot 206. A magnitude of the electric field is represented by β, which increases from 0.0, to 0.4, to 0.8, and to 1.2 when going, respectively, from contour plot 200, to contour plot 202, to contour plot 204, and to contour plot 206. The density of states is represented in FIG. 2A by shades of gray, which form the basis for the contours of each contour plot. Grayscale legends to the right of FIG. 2A match each shade of gray with a corresponding magnitude of the density of states. The density of states in the grayscale legends ranges from $10^{-3}$ to $10^{-1}$ $eV^{-1}$ $nm^{-2}$.

The abscissa of each contour plot shows a distance, in nanometers, from a center (i.e., r=0 nm) of the example 200-nm graphene flake. The example 200-nm graphene flake may define a field-responsive layer, such as the field-responsive layer 116 described in relation to FIGS. 1A-1C. A portion of the example 200-nm graphene flake at or immediately adjacent of the center may also define a target region, such as the target region 118 described in relation to FIGS. 1A-1C. The ordinate of each contour plot shows an energy level, in electron-volts (eV), that may be associated with an energy of the density of states. A dashed line 208 indicates a band profile for electrons that responds to the presence of the electric field. For non-zero electric fields (i.e., β>0), the band profile may define an electrostatic potential well around the center of the 200-nm graphene flake (or the target region thereof), as will be described in relation to contour plots 200, 202, 204, 206.

As shown by contour plot 200, the density of states at β=0 is constant when traversing a horizontal distance from r=−30 nm to r=30 nm. A band interval with a low density of states (e.g., about $10^{-3}$ $eV^{-1}$ $nm^{-2}$ or less) straddles the energy level of 0 eV from r=−30 nm to r=30 nm. In contour plot 200, no electric field is present (i.e., β=0) and the dashed line 208 is a horizontal along an energy level of about 0 eV. However, the presence of an electric field (i.e., β>0) can alter a profile of this band interval and form an electrostatic potential well. The electric field may be generated by one or more sources. For example, a projection (or tip thereof) may reside adjacent of the center of example 200-nm graphene flake. A voltage applied to the projection (or tip thereof) establishes a voltage potential relative to the example 200-nm graphene flake. This voltage potential may cause an electric field to emanate from the projection (or tip thereof) towards the center of the example 200-nm graphene flake. Other examples of the source include an inclusion in an atomic structure of the example 200-nm graphene flake, a substitution in an atomic structure of the example 200-nm graphene flake, a vacancy in an atomic structure of the example 200-nm graphene flake, and an atom or molecule on a surface of the example 200-nm graphene flake.

At β=0.4, the electric field (or voltage) alters the profile of the band interval and induces the formation of the electrostatic potential well, as shown by contour plot 202. The electric field also increases the density of states at approximately r=0 nm, which is concentrated at energy levels at or above 0 eV. The density of states at approximately r=0 nm corresponds to a local density of states. Increasing the electric field to β=0.8 widens the electrostatic potential well and increases its bending, as shown by contour plot 204. The local density of states continues to increase in magnitude and extends to energy levels below 0 eV. At β=1.2, the local density of states has increased notably in magnitude, especially at energy levels below 0 eV as shown by contour plot 206. It will be appreciated that the electric field (or voltage), by inducing the formation of the electrostatic potential well and increasing the local density of states, may confine one or more electrons in the target region of the example 200-nm graphene flake. Such localization of electrons may allow the target region to have quantum states that can be controlled by one or both of the electric field and a magnetic field.

Figure 2B:
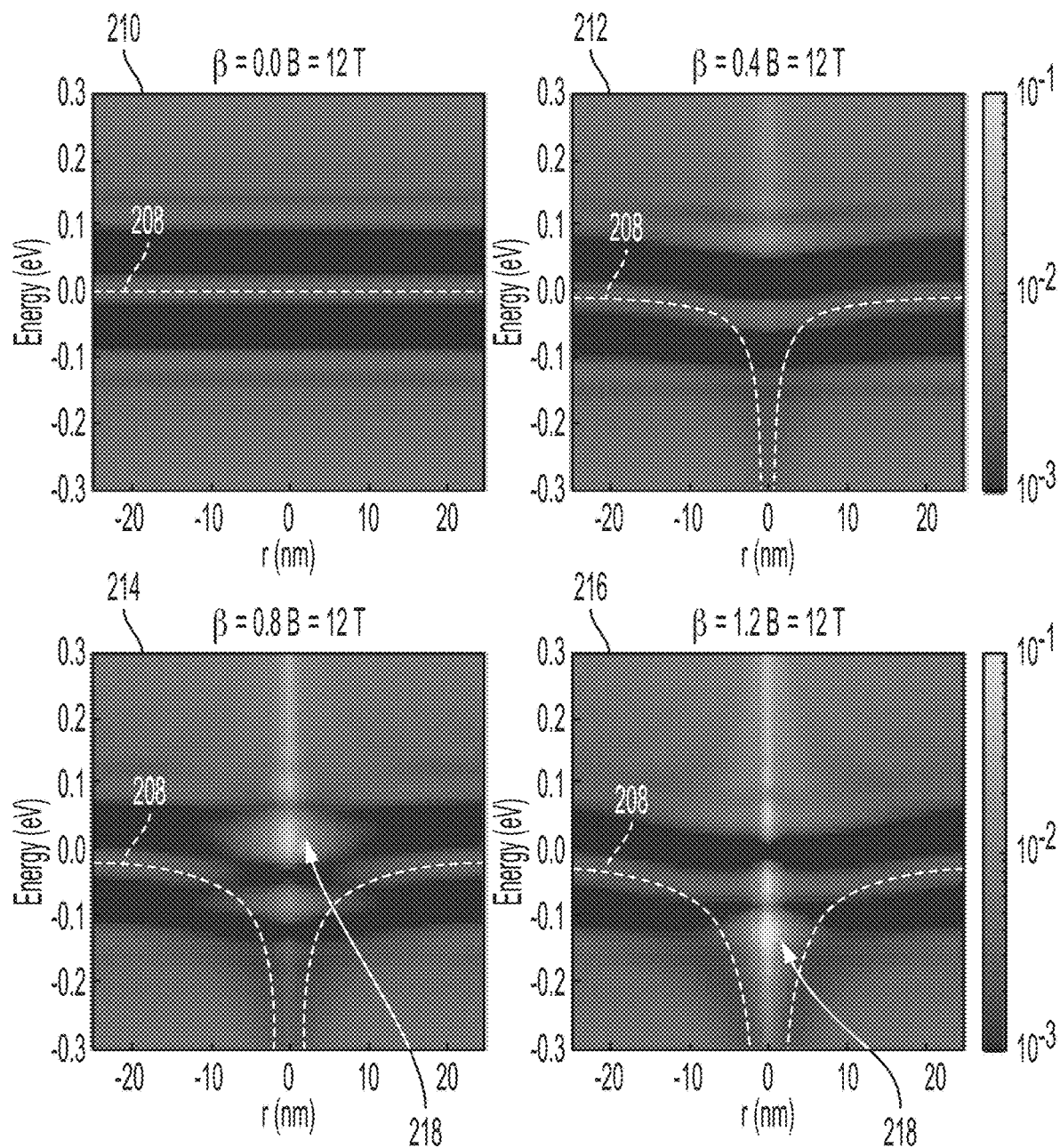
FIG. 2B presents four contour plots showing the simulated influence of an electric field and a 12 T magnetic field on an example 200-nm graphene flake having armchair boundaries.

For example, the presence of a magnetic field may cause the local density of states to split into a plurality of discrete energy levels (or Landau levels) that can define one or more quantum states. The one or more quantum states may be associated with the target region of the 200-nm graphene flake. FIG. 2B presents four contour plots 210, 212, 214, 216 showing the simulated influence of an electric field and a 12 T magnetic field on an example 200-nm graphene flake having armchair boundaries. The four contour plots are generated from a computer simulation of the electric and 12 T magnetic fields on the example 200-nm graphene flake using a Pybinding library. The contour plots 210, 212, 214, 216 are analogous to the contour plots 200, 202, 204, 206 of FIG. 2A, except that the example 200-nm graphene flake is simulated in the further presence of the 12 T magnetic field. For β=0, the density of states is again constant when traversing the horizontal distance from r=−30 nm to r=30 nm. However, the presence of the 12 T magnetic field causes two band intervals to emerge where only one was present with no magnetic field (compare to contour plot 200 of FIG. 2A). In particular, a first band interval resides below 0 eV and a second band interval resides above 0 eV. The first and second band intervals are separated by a narrow band interval at approximately 0 eV having a density of states of about $10^{-2}$ $eV^{-1}$ $nm^{-2}$. The dashed line 208 is a horizontal along an energy level of about 0 eV and disposed within the narrow band interval.

At β=0.4, the electric field (or voltage) alters the profile of the first band interval, the second band interval, and the narrow band interval, and induces the formation of the electrostatic potential well, as shown by contour plot 212. The electric field also increases a magnitude of the local density of states (i.e., at approximately r=0 nm), which is concentrated at energy levels above the second band interval. Increasing the electric field to β=0.8 causes a splitting of the narrow band interval into two portions, one portion in the first band interval and one portion in the second band interval as shown by contour plot 214. Increasing the electric field also widens the electrostatic potential well and increases its bending. The local density of states continues to increase in magnitude and extends to energy levels below 0 eV. Moreover, the local density of states is split into a plurality of discrete energy levels 218, which may correspond to Landau levels. The plurality of discrete energy levels 218 may define one or more quantum states. Further increasing the electric field to β=1.2 may cause additional splitting of the plurality of discrete energy levels 218. However, the increased electric field may also increase the magnitude of the local density of states, especially at energy levels below 0 eV, as shown by contour plot 216. The increased local density of states may allow one or more electrons to become increasingly confined at the target region of the example 200-nm graphene flake.

As shown by contour plots 210, 212, 214, and 216, control of the electric field allows the localization of electrons within the target region of the example 200-nm graphene flake. But due to the presence of the 12 T magnetic field, such control also allows the localized electrons to be distributed among the plurality of discrete energy levels 218. The electrons, the plurality of discrete energy levels 218, or both may be manipulated by altering a magnitude of the electric field, which may manipulate respective quantum states of the electrons and the plurality of discrete energy levels 218. Such manipulation may allow a property of the target region (or the example 200-nm graphene flake) to be created or altered. Such manipulation may also allow for storing and manipulating information represented by the quantum states. Although the contour plots 210, 212, 214, 216 present the simulation in the context of a constant magnetic field, the magnetic field may also be altered in magnitude to manipulate one or both of the electrons and the plurality of discrete energy levels 218.

Now referring back to FIGS. 1A-1C, in some implementations, the example quantum control device 100 includes an optical waveguide associated with the target region 118. The optical waveguide may be defined by the insulator layer 110 (or a portion thereof), the field-responsive layer 116 (or a portion thereof), the cavity 108 (or a portion thereof), or any combination thereof. In some instances, the optical waveguide may include one or more sublayers of the insulator layer 110, one or more sublayers of the field-responsive layer 116, or both. The optical waveguide may be configured to propagate photons in-plane within one or both of the insulator layer 110 and the field-responsive layer 116. The optical waveguide may also be configured to propagate photons out-of-plane of the insulator layer 110 or the field-responsive layer 116. For example, the optical waveguide may include surfaces associated with the cavity 108—e.g., an end surface, a sidewall surface, and so forth—that allow reflection of the photons along a longitudinal axis of the projection 104 (or plurality of projections).

The optical waveguide may have an active volume for propagating (or resonating) photons therein. These photons may be frequency-shaped or pulse-shaped to optimize a nature and a purity of desired, discrete quantum states. The photons may have wavelengths that correspond to microwave wavelengths, infrared wavelengths, visible light wavelengths, or ultraviolet wavelengths. Other wavelengths are possible. During operation, photons within the active volume may couple to a quantum state of the target region 118 associated with the optical waveguide. The optical waveguide may thus be used to select or control a quantum state of the target region 118. The optical waveguide may also be used to induce a new quantum state in the target region 118. Coupling between the photons and the quantum state may modify an energy of the quantum state. Such coupling may also establish a quantum system whose behavior is governed by cavity quantum electrodynamics.

A quantum control method may be used to operate the quantum control device 100 described in relation to FIGS. 1A-1C, according to an illustrative example. The quantum control method includes generating an electric field from a projection on a substrate. The projection extends from a substrate surface of the substrate into a cavity defined by an insulator layer. Moreover, the insulator layer is disposed over the substrate surface and comprises an insulator surface that defines an opening to the cavity. The quantum control method also includes receiving the electric field at a target region of a field-responsive layer. The field-responsive layer is disposed over the insulating layer, and the target region resides over the opening of the cavity. The quantum control method additional includes controlling the electric field to interact with a quantum state in the target region of the field-responsive layer. In some instances, the quantum control method includes transferring no electrons from the projection to the target region of the field-responsive layer while generating the electric field. In some instances, the quantum control method includes transferring an electron from the projection to the target region of the field-responsive layer while generating the electric field.

In some implementations, generating the electric field at the projection includes concentrating the electric field with a tip of the projection. In these implementations, receiving the electric field at the target region includes receiving the concentrated electric field at the target region. The concentrated electric field may have a magnitude of at least $1\times10^5$ V/m. In some instances, the concentrated electric field has a magnitude of at least $1\times10^9$ V/m. In some instances, the concentrated electric field has a magnitude of at least $1\times10^{10}$ V/m. In some instances, the concentrated electric field has a magnitude of at least $1\times10^{11}$ V/m. In some instances, the concentrated electric field has a magnitude of at least $1\times10^{12}$ V/m.

In some implementations, generating the electric field from the projection includes applying a voltage to an electrical contact below the substrate and opposite a base of the projection. Generating the electric field from the projection also includes transferring the voltage through the substrate to the projection. In some implementations, the quantum control method includes transferring an electrical signal from the projection to an electrical contact below the substrate and opposite a base of the projection. The electrical signal can be used to characterize the quantum state of the target region.

In some implementations, the substrate surface is a first substrate surface and the substrate includes a second substrate surface opposite the first substrate surface. In these implementations, generating the electric field from the projection includes receiving a beam of light at an optical focusing structure opposite a base of the projection. The optical focusing structure is formed on the second substrate surface. Generating the electric field from the projection also includes guiding light to the projection with the optical focusing structure.

In some implementations, the quantum control method includes receiving a beam of light at the target region of the field-responsive layer. For example, the beam of light may be received by a nanoparticle disposed on a metallic surface of the field-responsive layer. The nanoparticle and metallic surface may define an inclusion in the target region of the field-responsive layer. In another example, the beam of light may eject one or more electrons from the target region by processes of photoemission. In further implementations, the quantum control method includes receiving, at an electron spectrometer, electrons emitted from the target region in response to the beam of light.

In some implementations, controlling the electric field to interact with the quantum state includes altering a magnitude of the electric field to alter the quantum state in the target region of the field-responsive layer.

In some implementations, the tip resides in the cavity less than 100 nm from the target region. In some implementations, the tip resides in the cavity less than 20 nm from the target region. In some implementations, the tip resides in the cavity less than 15 nm from the target region. In some implementations, the tip resides in the cavity less than 10 nm from the target region. In some implementations, the tip resides in the cavity less than 5 nm from the target region. In some implementations, the tip resides in the cavity less than 1 nm from the target region.

In some implementations, the projection is formed of a material having a work function at least 4.0 eV. In some implementations, the projection is formed of a material having a work function at least 4.2 eV. In some implementations, the projection is formed of a material having a work function at least 4.4 eV. In some implementations, the projection is formed of a material having a work function at least 4.6 eV. In some implementations, the projection is formed of a material having a work function at least 4.8 eV. In some implementations, the projection is formed of a material having a work function at least 5.0 eV. In some implementations, the projection has a height-to-width ratio in a range of 2:1 to 10000:1. In some implementations, the projection has a height-to-width ratio in a range of 20:1 to 200:1.

In some implementations, the target region includes an inclusion in an atomic structure of the field-responsive layer. In some implementations, the target region includes a substitution in an atomic structure of the field-responsive layer. In some implementations, the target region includes a vacancy in an atomic structure of the field-responsive layer. In some implementations, the target region includes an atom or molecule on a surface of the field-responsive layer. The atom or molecule may include a plurality of atoms or molecules, and as such, may be an individual atom, a cluster of atoms, a chemical functional group, a nanoparticle, one or more molecules, a two-dimensional island of atoms or molecules, a stacked heterostructure based on an ordered arrangement of atom, a patterned overlayer of atoms, and so forth. The atom or molecule may be disposed on an exterior surface of the field-responsive layer. The atom or molecule may also be disposed on an interior surface of the field-responsive layer. In some instances, both the exterior and interior surfaces of the field-responsive layer have an atom or molecule disposed thereon.

Figure 3A:
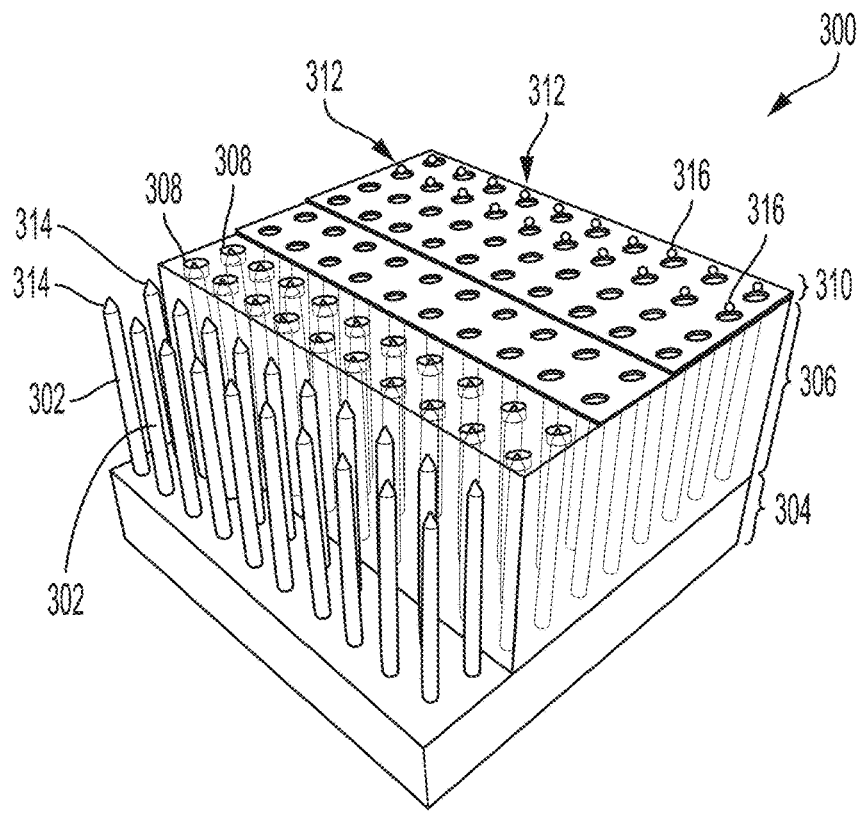
FIG. 3A is a schematic diagram, in perspective view, of an example quantum control device that includes a plurality of projections disposed on a substrate.
Figure 3B:
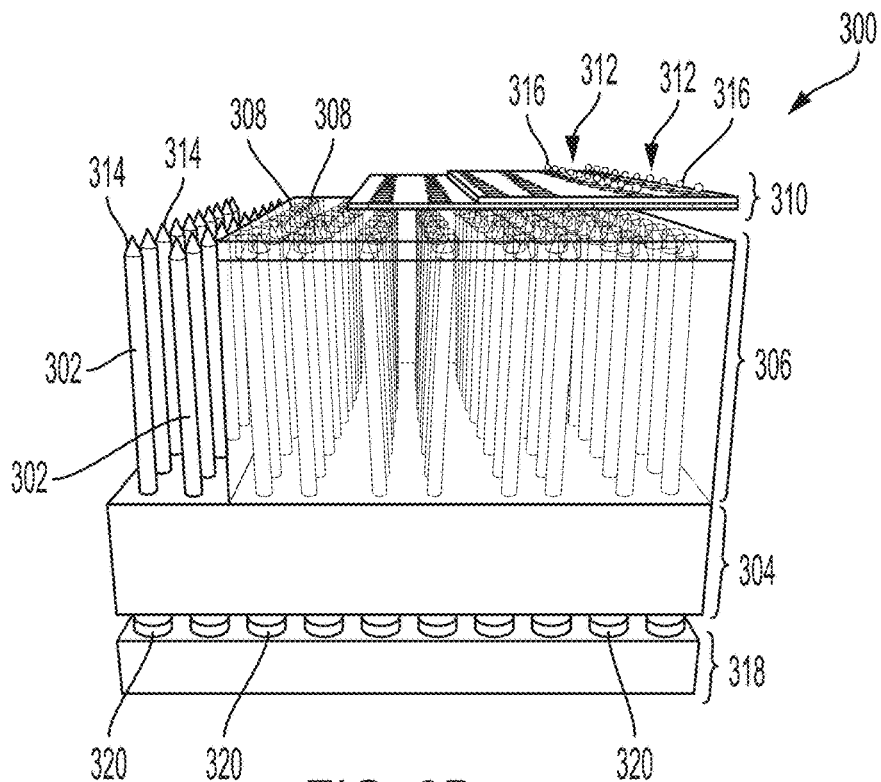
FIG. 3B is a schematic diagram, in cross-section, of the example quantum control device of FIG. 3A.

Now referring to FIG. 3A, a schematic diagram is presented, in perspective view, of an example quantum control device 300 that includes a plurality of projections 302 disposed on a substrate 304. Certain features of the example quantum control device 300 have portions omitted to allow other features to be visible in FIG. 3A. FIG. 3B presents a schematic diagram, in cross-section, of the example quantum control device 300 of FIG. 3A. One or more of plurality of projections in FIGS. 3A and 3B may be associated with individual instances of the example quantum control device 100 described in relation to FIGS. 1A-1C.

The example quantum control device 300 includes the substrate 304 and an insulator layer 306 that defines an array of cavities 308. The example quantum control device 300 also includes a field-responsive layer 310 that is disposed over the insulator layer 306 and includes an array of target regions 312. In FIGS. 3A & 3B, the field-responsive layer 310 is depicted as having two layers. However, other numbers of layers are possible for the field-responsive layer 310 (e.g., 1, 5, etc.). Each target region 312 is aligned with a corresponding cavity 308. Projections 302 extend from the substrate 304 into respective cavities 308 and each is configured to produce an electric field. The electric field interacts with a quantum state of a target region adjacent the projection and controls quantum coupling between the quantum state of the target region and a quantum state of a neighboring target region.

Figure 4A:
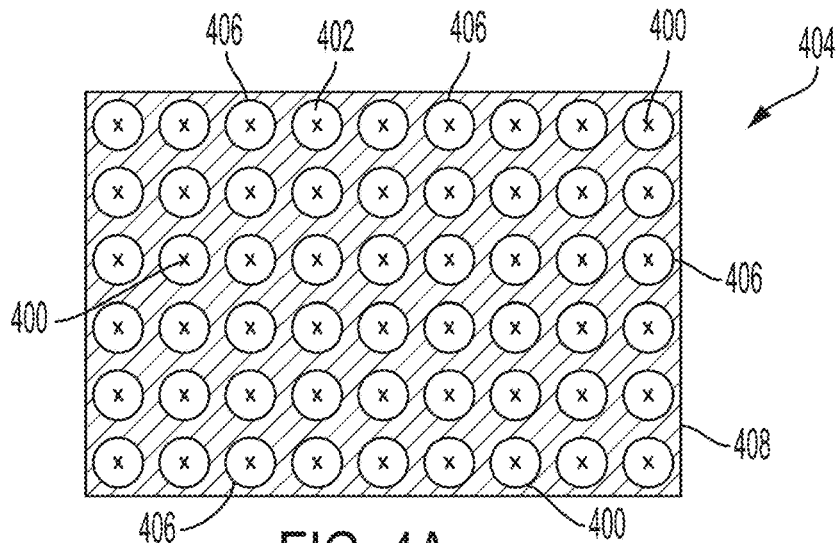
FIG. 4A is a schematic diagram, in top view, of a plurality of projections extending from a substrate into respective cavities of an insulator layer to define a rectilinear array.
Figure 4B:
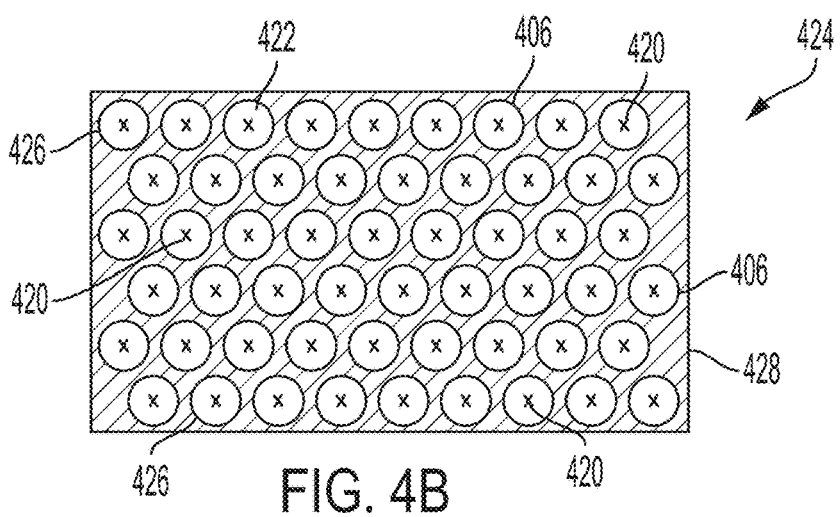
FIG. 4B is a schematic diagram, in top view, of a plurality of projections extending from a substrate into respective cavities of an insulator layer to define a hexagonal array.

In many implementations, the plurality of projections 302 defines a two-dimensional array. For example, as shown in FIG. 4A, a plurality of projections 400 may extend from a substrate 402 to define a rectilinear array 404. One projection 400 is associated with each respective cavity 406 in an insulator layer 408. In another example, as shown in FIG. 4B, a plurality of projections 420 may extend from a substrate 422 to define a hexagonal array 424. One projection 420 is associated with each respective cavity 426 in an insulator layer 428.

Figure 4C:
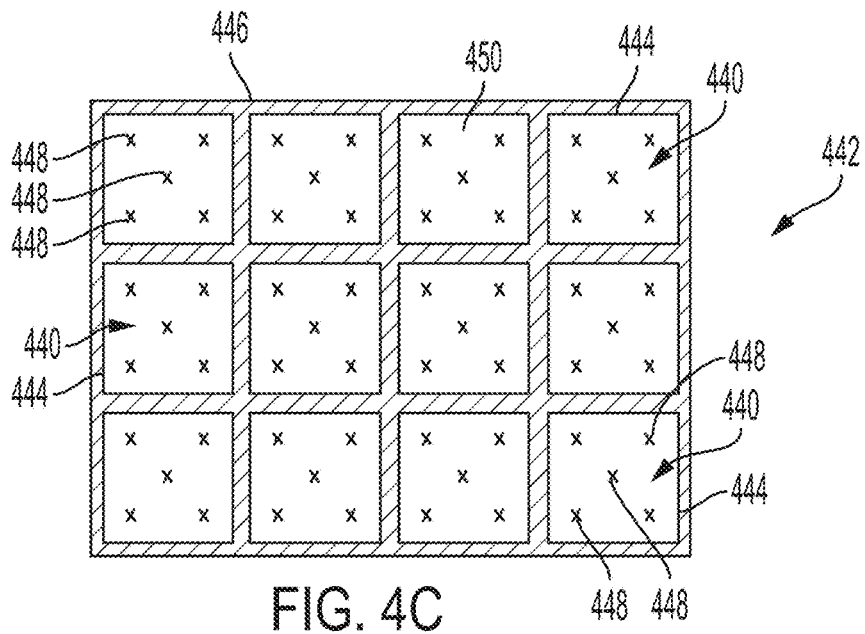
FIG. 4C is a schematic diagram, in top view, of a plurality of projection subsets extending from a substrate into respective cavities of an insulator layer to define a rectilinear array.

The plurality of projections 302 may also define a two-dimensional array different than that defined by the array of cavities 308. In some implementations, at least one projection 302 includes a subset of projections 302, each producing a respective electric field that defines part of the electric field. For example, as shown in FIG. 4C, a plurality of projection subsets 440 may define a rectilinear array 442. Each projection subset 440 is associated with a corresponding cavity 444 in an insulator layer 446 and has five projections 448 that extend from a substrate 450 into the corresponding cavity 444. However, other numbers and arrangements of projections are possible for each projection subset 440. Moreover, the projection subsets 440 may define a two-dimensional array other than a rectilinear array.

The plurality of projections 302 may be ordered to determine a distance between neighboring target regions 312. In some implementations, the distance may be less than or equal to 10 µm. The distance may be the same for all neighboring target regions 312. For example, a distance between neighboring target regions 312 may be less than or equal to 1000 nm for all neighboring target regions 312. The distance may also be different between portions of neighboring target regions 312. For example, the neighboring target regions 312 may include a first portion having a distance equal to or less than 700 nm and a second portion having a distance equal to or less than 300 nm. Other combinations of portions and distances are possible.

In some instances, a distance between neighboring target regions 312 is less than or equal to 1000 nm. In some instances, a distance between neighboring target regions 312 is less than or equal to 900 nm. In some instances, a distance between neighboring target regions 312 is less than or equal to 800 nm. In some instances, a distance between neighboring target regions 312 is less than or equal to 700 nm. In some instances, a distance between neighboring target regions 312 is less than or equal to 600 nm. In some instances, a distance between neighboring target regions 312 is less than or equal to 500 nm. In some instances, a distance between neighboring target regions 312 is less than or equal to 400 nm. In some instances, a distance between neighboring target regions 312 is less than or equal to 300 nm. In some instances, a distance between neighboring target regions 312 is less than or equal to 200 nm.

Each projection 302 may have a height-to-width ratio in the range of 2:1 to 10000:1. In some instances, each projection 302 has a height-to-width ratio in a range of 20:1 to 200:1. Each projection 302 may also be formed of a material having a work function of at least 4.0 eV. In some instances, each projection 302 is formed of a material having a work function of at least 4.2 eV. In some instances, each projection 302 is formed of a material having a work function of at least 4.4 eV. In some instances, each projection 302 is formed of a material having a work function of at least 4.6 eV. In some instances, each projection 302 is formed of a material having a work function of at least 4.8 eV. In some instances, each projection 302 is formed of a material having a work function of at least 5.0 eV.

Each projection 302 may also terminate at a tip 314 that resides in the respective cavity 308. The tip 314 may end at a distance from the target region 312 adjacent the projection 302. In many variations, the distance is the same for all tips 314 associated with the plurality of projections 302. In some instances, the tip 314 resides in the respective cavity 308 less than 100 nm from the adjacent target region 312. In some instances, the tip 314 resides in the respective cavity 308 less than 20 nm from the adjacent target region 312. In some instances, the tip 314 resides in the respective cavity 308 less than 15 nm from the adjacent target region 312. In some instances, the tip 314 resides in the respective cavity 308 less than 10 nm from the adjacent target region 312. In some instances, the tip 314 resides in the respective cavity 308 less than 5 nm from the adjacent target region 312. In some instances, the tip 314 resides in the respective cavity 308 less than 1 nm from the adjacent target region 312.

In some implementations, each projection 302 terminates in a tip configured to concentrate the electric field produced by the projection. The tip may be configured to concentrate the electric field to a magnitude of at least $1\times10^5$ V/m in the target region adjacent the projection. In some instances, the tip is configured to concentrate the electric field to a magnitude of at least $1\times10^9$ V/m in the target region adjacent the projection. In some instances, the tip is configured to concentrate the electric field to a magnitude of at least $1\times10^{10}$ V/m in the target region adjacent the projection. In some instances, the tip is configured to concentrate the electric field to a magnitude of at least $1\times10^{11}$ V/m in the target region adjacent the projection. In some instances, the tip is configured to concentrate the electric field to a magnitude of at least $1\times10^{12}$ V/m in the target region adjacent the projection.

In some implementations, the substrate 304, the insulator layer 306, and the field-responsive layer 310 define an enclosed space in each cavity 308. The enclosed space includes a first clearance volume between a respective projection 302 and the insulator layer 306. In some variations, the enclosed space may also include a second clearance volume between a tip of the respective projection 302 and field-responsive layer 310. The enclosed space may contain a vacuum pressure no greater than $10^{-5}$ Torr. In some instances, the enclosed space contains a vacuum pressure no greater than $10^{-8}$ Torr. In some instances, the enclosed space is filled at least partially with a dielectric material.

In some implementations, at least one target region 312 includes an inclusion in an atomic structure of the field-responsive layer 310. In some implementations, each target region 312 includes an inclusion in an atomic structure of the field-responsive 310. The inclusions collectively define an array of inclusions aligned with the array of target regions 312. In some implementations, at least one target region 312 includes a substitution in an atomic structure of the field-responsive layer 310. In some implementations, each target region 312 includes a substitution in an atomic structure of the field-responsive 310. The substitutions collectively define an array of inclusions aligned with the array of target regions 312. In some implementations, at least one target region 312 includes a vacancy in an atomic structure of the field-responsive layer 310. In some implementations, each target region 312 includes a vacancy in an atomic structure of the field-responsive 310. The vacancies collectively define an array of vacancies aligned with the array of target regions 312.

In some implementations, at least one target region 312 includes an atom or molecule on a surface of the field-responsive layer 310. The atom or molecule may be disposed on an exterior surface of the field-responsive layer 310. The atom or molecule may also be disposed on an interior surface of the field-responsive layer 310. In some instances, both the exterior and interior surfaces of the field responsive layer 310 have an atom or molecule disposed thereon. In some implementations, each target region 312 includes an atom or molecule on a surface of the field-responsive 310. The atoms or molecules collectively define an array of atoms or molecules aligned with the array of target regions 312. FIGS. 2A and 2B depict the example quantum control device 300 as having an array of atoms or molecules 316 on an exterior surface of the field-responsive layer 310. In particular, each target region 312 includes an atom or molecule on the exterior surface of the field-responsive layer 310. The atom or molecule may include an individual atom, a cluster of atoms, a chemical functional group, a nanoparticle, one or more molecules, a two-dimensional island of atoms or molecules, a stacked heterostructure based on an ordered arrangement of atoms, a patterned overlayer of atoms, and so forth.

In some implementations, such as shown in FIG. 3B, the example quantum control device 300 includes an addressing layer 318 below the substrate 304 that includes electrical contacts 320 configured to receive voltage signals. Each electrical contact 320 is aligned with a respective projection 302. In some variations, each electrical contact 320 is configured to deliver a respective voltage signal to the substrate 304 independent of the other electrical contacts. The substrate 304 is configured to transfer the respective voltage signal to a projection aligned with the electrical contact 320 to produce a respective electrical field. In some variations, each electrical contact 320 is configured to receive an electrical signal from the substrate 304 independent of the other electrical contacts. The electrical signal can be used to characterize a quantum state of a target region 312 adjacent a projection aligned with the electrical contact. The substrate 304 is configured to transfer the electrical signal from the aligned projection to the electrical contact.

In some implementations, the projection 302 includes a subset of projections and the example quantum control device 300 includes an addressing layer 318 below the substrate 304 that includes a plurality of electrical contacts 320. Each electrical contact 320 is aligned with a respective subset of projections and configured to receive a voltage signal for the respective subset of projections. In some variations, each electrical contact 320 is configured to deliver a respective voltage signal to the substrate 304 independent of the other electrical contacts. The substrate 304 is configured to transfer the respective voltage signal to a subset of projections aligned with the electrical contact to produce a respective electrical field. In some variations, each electrical contact 320 is configured to receive an electrical signal from the substrate 304 independent of the other electrical contacts. The electrical signal can be used to characterize a quantum state of a target region 312 adjacent a projection aligned with the electrical contact. The substrate 304 is configured to transfer the electrical signal from the aligned projection to the electrical contact.

In operation, the example quantum control device 300 receives a voltage signal at one or more electrical contacts 320. The substrate 304 transfers the voltage signal(s) to one or more corresponding projections 302 (or subsets of projections) to establish a voltage potential, which may be an electrostatic voltage potential. The voltage potential may be between the one or more corresponding projections 302 (or subsets of projections) and their respective target regions 312. The voltage signal may be applied continuously or through voltage pulses. The voltage pulses may have a time duration less than or equal to 1 millisecond. In some instances, the time duration is less than or equal to 1 picosecond. In some instances, the time duration is less than or equal to 100 femtoseconds (e.g., 10-40 femtoseconds).

The voltage signal from the one or more electrical contacts may be supplemented by a laser to establish the voltage potential. For example, the laser may generate a coherent beam of electromagnetic radiation that is received by one or more target regions 312, one or more projections 302 (or subset or projections), or both. Upon receipt, an electric field component of the coherent beam of electromagnetic radiation may alter the voltage potential (e.g., increase the voltage potential) between the one or more corresponding projections 302 (or subset of projections) and their respective target regions 312. The voltage potential may include pulses having a time duration. In some instances, the time duration of the pulses is less than or equal to 1 picosecond. In some instances, the time duration of the pulses is less than or equal to 100 femtoseconds (e.g., 10-40 femtoseconds).

In response, an electric field is generated by each of the one or more corresponding projections 302 (or subsets of projections), during which, the electric field(s) extends from respective tips 314 of the one or more corresponding projections 302 to penetrate respective target regions 312. The tips 314 assist, in part, to concentrate the electric field(s) to high magnitudes, and as such, the respective target regions 312 may receive electric fields having a magnitude of at least $1\times10^5$ V/m. In many instances, the magnitude is greater than $1\times10^9$ V/m. Upon receiving the electric field(s), a quantum state associated with each target region 312 may emerge or be altered in characteristic (e.g., altered in number, occupancy, spin, energy, size, spatial distribution, coupling to other quantum states, etc.). The electric field(s) may be varied, e.g., by changing the voltage signal(s) received by the one or more electrical contacts 320, to control quantum coupling between the quantum states of neighboring target regions.

During operation, the electrical contacts 320 may also receive electrical signals from respective projections 302 that are used to characterize one or more quantum states of each target region 312 adjacent the respective projections 302. The electrical signals are transferred through the substrate 304 from the respective projections 302. The addressing layer 318 is configured such that the electric contacts 320 may receive electrical signals from one target region 312 independent of the other target regions 312. Similarly, the electrical contacts may also apply voltages to generate (or vary) the electrical fields for one target region 312 independent of other target regions 312. Such configuration of the addressing layer 318 allows the example quantum control device 300 to manipulate the quantum states of any combination of target regions 312 and control the quantum coupling between any combination of target regions 312.

In some implementations, the quantum state associated with each target region 312 is a discrete, localized quantum state. In these implementations, the tips 314 of the projections 302 may be positioned sufficiently close that the discrete, localized quantum states overlap. A degree of overlap may be further altered by changing one or more of the electric fields generated by the projections 302 (or subset of projections). Such overlap may induce a new collective quantum state supported by the array of target regions 312 in the field-responsive layer. This collective quantum state may itself have one or more discrete states, and some instances, may also have a band structure. The electric fields generated by the projections 302 (or subset of projections), which may include an electrostatic voltage potential between the tips 314 and their respective target regions 312, can be used to control and modify the properties of these collective quantum states.

In some implementations, the example quantum control device 300 includes an optical waveguide associated with at least one target region 312 of the array of target regions 312. The optical waveguide may be defined by the insulator layer 306 (or a portion thereof), the field-responsive layer 310 (or a portion thereof), one or more cavities 308 (or a portion thereof), or any combination thereof. In some instances, the optical waveguide may include one or more sublayers of the insulator layer 306, one or more sublayers of the field-responsive layer 310, or both. The optical waveguide may be configured to propagate photons in-plane within one or both of the insulator layer 306 and the field-responsive layer 310. The optical waveguide may also be configured to propagate photons out-of-plane of the insulator layer 306 or the field-responsive layer 310. For example, the optical waveguide may include surfaces associated with a cavity 308—e.g., an end surface, a sidewall surface, and so forth—that allow reflection of the photons along a longitudinal axis of the projection 302 (or subset of projections).

The optical waveguide may have an active volume for propagating (or resonating) photons therein. These photons may be frequency-shaped or pulse-shaped to optimize a nature and a purity of desired, discrete quantum states. The photons may have wavelengths that correspond to microwave wavelengths, infrared wavelengths, visible light wavelengths, or ultraviolet wavelengths. Other wavelengths are possible. During operation, photons within the active volume may couple to a quantum state of the at least one target region 312 associated with the optical waveguide. The optical waveguide may thus be used to select or control a quantum state of the at least one target region 312. The quantum state may be associated with a single target region. If multiple target regions 312 are associated with the optical waveguide, the quantum state may be associated with two or more target regions. The optical waveguide may also be used to induce a new quantum state in the at least one target region 312. The new quantum state may be associated with a single target region. If multiple target regions 312 are associated with the optical waveguide, the new quantum state may be associated with two or more target regions. Coupling between the photons and the quantum state may modify an energy of the quantum state. Such coupling may also establish a quantum system whose behavior is governed by cavity quantum electrodynamics.

The example quantum control device 300 may include a plurality of such quantum systems. The addressing layer 318 may allow the quantum systems to be manipulated individually or allow the quantum systems to be manipulated in subgroups (e.g., neighboring groups). In implementations having the plurality of quantum systems, the corresponding optical waveguides may act as a complex photonic waveguide that operates throughout the quantum control device 300 to interact with the array of target regions 312.

In some implementations, the example quantum control device 300 includes a laser system configured to direct a laser signal to the array of target regions 312. The laser may be operable to eject one or more electrons from one or more target regions 312 by processes of photoemission. The example quantum control device 300 also includes an electron spectrometer configured to receive electrons emitted from the array of target regions 312 in response to the laser system. The electron spectrometer may be able to determine characteristics of one or more quantum states associated with each target region 312 by measuring properties of respective electrons emitted therefrom (e.g., an energy of the respective electrons). In further implementations, the example quantum control device 300 may include an optical spectrometer configured to determine characteristics of one or more quantum states associated with each target region 312 by measuring properties of photons.

The example quantum control device 300 may utilize optical stimulation of the plurality of projections 302 to generate, or assist in generating, the respective electric fields. In some implementations, the example quantum control device 300 includes an array of optical focusing structures below the substrate, each aligned opposite a respective cavity 308 and configured to guide light to a projection associated with the respective cavity 308. The optical focusing structures may include diffractive patterns, lenses, or mirrors. Other optical focusing structures are possible.

Figure 5A:
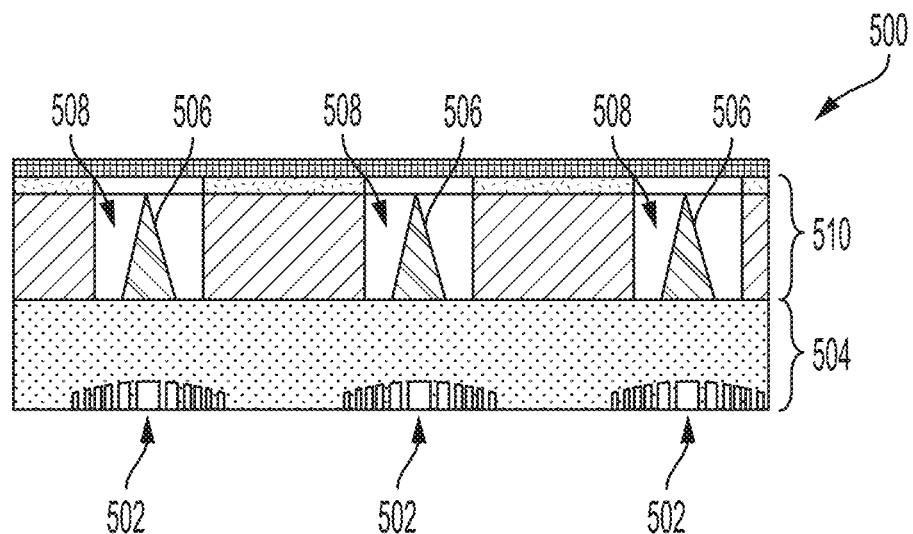
FIG. 5A is a schematic diagram, in cross-section, of an example quantum control device having an array of diffractive patterns formed into a substrate.
Figure 5B:
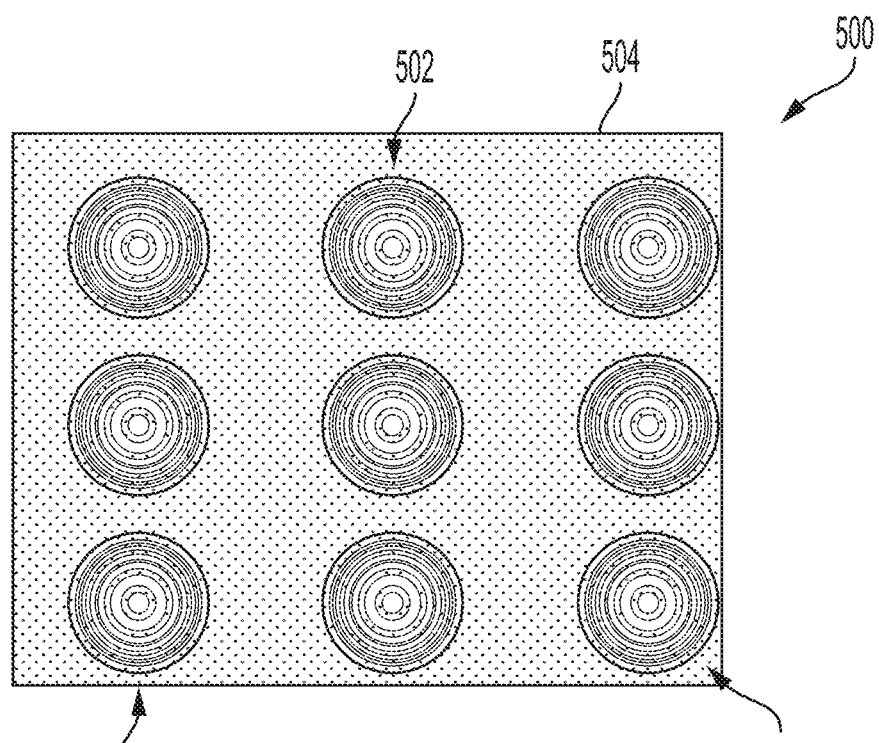
FIG. 5B is a schematic diagram, in bottom view, of the example quantum control device of FIG. 5A.
Figure 6A:
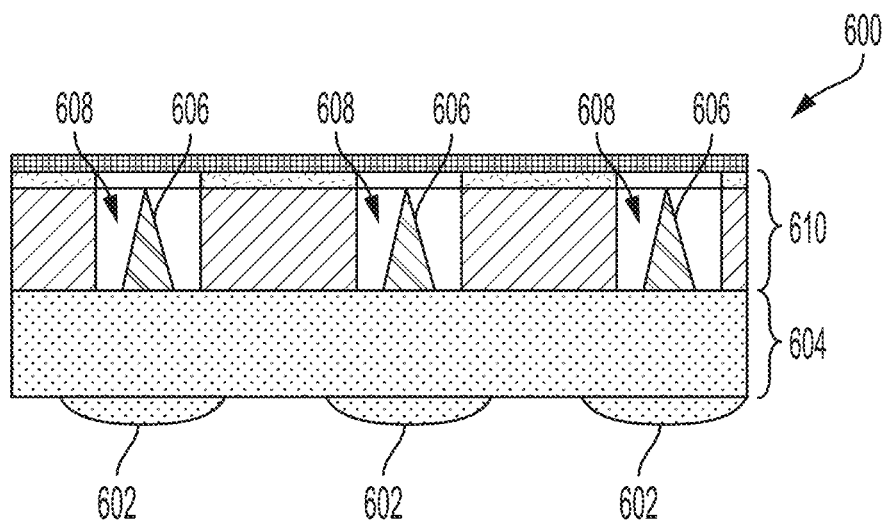
FIG. 6A is a schematic diagram, in cross-section, of an example quantum control device having an array of lenses formed onto a substrate.
Figure 6B:
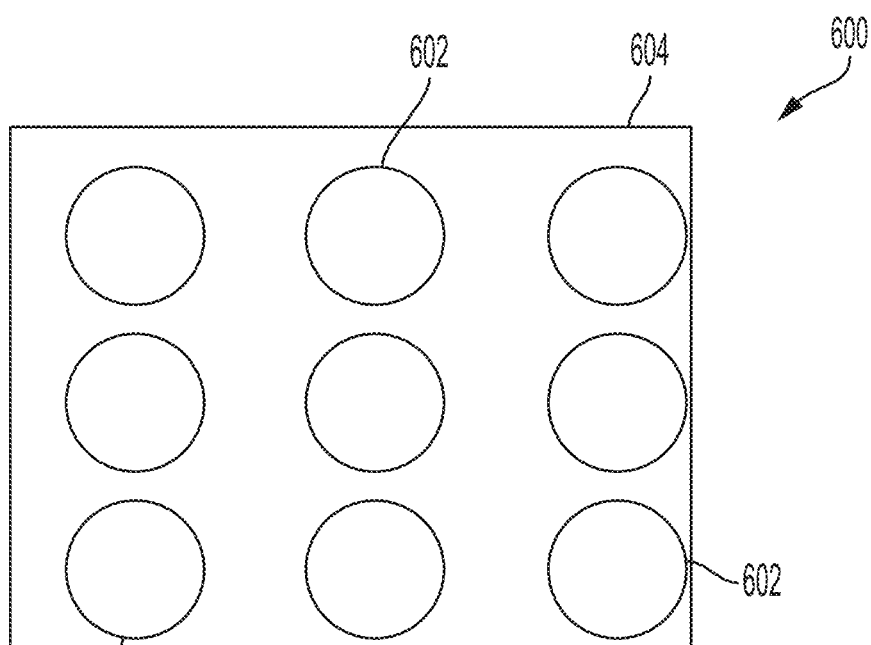
FIG. 6B is a schematic diagram, in bottom view, of the example quantum control device of FIG. 6A.

For example, FIG. 5A presents a schematic diagram, in cross-section, of an example quantum control device 500 having an array of diffractive patterns 502 formed into a substrate 504. FIG. 5B presents a schematic diagram, in bottom view, of the example quantum control device 500 of FIG. 5A. The array of diffractive patterns 502 are aligned with an array of projections 506 extending from the substrate 504 into a corresponding array of cavities 508 in an insulating layer 510. In another example, FIG. 6A presents a schematic diagram, in cross-section, of an example quantum control device 600 having an array of lenses 602 formed onto a substrate 604. FIG. 6B presents a schematic diagram, in bottom view, of the example quantum control device 600 of FIG. 6A. The lenses may be part of the substrate 604, or alternatively, be coupled to the substrate 604 (e.g., fabricated on the substrate 604 by microelectronics manufacturing processes). The array of lenses 602 are aligned with an array of projections 606 extending from the substrate 604 into a corresponding array of cavities 608 in an insulating layer 610.

The example quantum control device 300 may also use plasmonic process with optical stimulation to induce the plurality of projections 302 to generate, or assist in generating, the respective electric fields. In some implementations, the example quantum control device 300 includes a conductive layer that comprises voids arranged along a periodic lattice. The periodic lattice has first sites occupied by voids and second sites not occupied by voids. The second sites are aligned opposite the array of cavities 308, and in some variations, the second sites are aligned opposite a subset of cavities in the array of cavities 308. The conductive layer may be below the substrate 304, or alternatively, over the field-responsive layer 310. In some variations, a first instance of the conductive layer may be below the substrate 304 and a second instance the conductive layer may be below over the field-responsive layer 310.

Figure 7A:
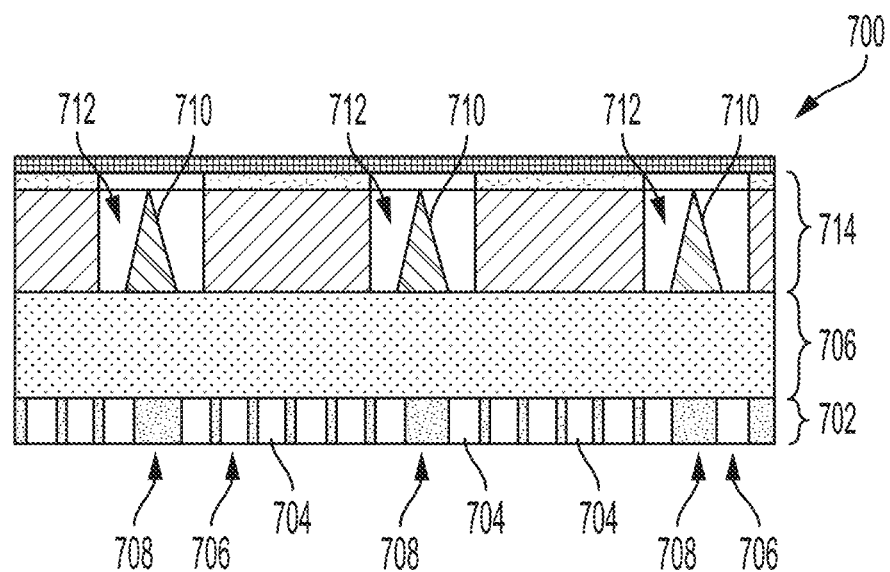
FIG. 7A is a schematic diagram, in cross-section, of an example quantum control device having a conductive layer that includes a plurality of voids.
Figure 7B:
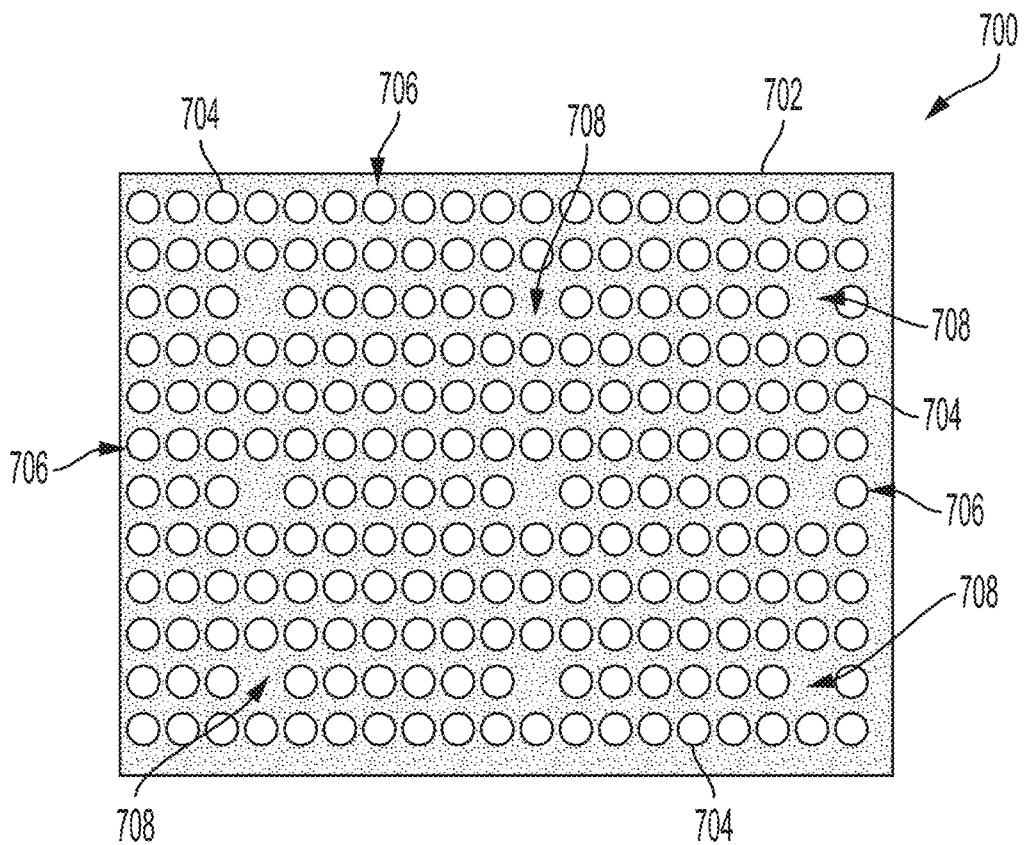
FIG. 7B is a schematic diagram, in bottom view, of the example quantum control device of FIG. 7A.

FIG. 7A presents a schematic diagram, in cross-section, of an example quantum control device 700 having a conductive layer 702 that includes a plurality of voids 704. FIG. 7B presents a schematic diagram, in bottom view, of the example quantum control device 700 of FIG. 7A. The conductive layer 702 is disposed below a substrate 706 of the example quantum control device 700. The plurality of voids 704 are arranged on a periodic lattice having first sites 706, where voids are present, and second sites 708, where voids are absent. The second sites 708 are aligned with an array of projections 710 extending from the substrate 706 into a corresponding array of cavities 712 in an insulating layer 714. During operation, light is received by the conductive layer 702, inducing the migration of electric charges to the second sites 708 via plasmonic processes. Concentration of the electric charges at the second sites 708 creates high electric fields that propagate through the substrate 706 and corresponding projections 710 to subsequently emerge from tips of the corresponding projections 710. The high electric fields may be in addition to the electric field generated by the plurality of projections 710 (e.g., in response to an applied voltage).

In some implementations, the example quantum control device 300 includes a plurality of trenches formed into the substrate 304 and arranged to isolate individual projections 302 extending from the substrate 304. Such isolation may be electrical isolation. In some implementations, a plurality of trenches is formed into the substrate 304 and arranged to isolate a subset of projections 302 extending from the substrate 304. Such isolation may be electrical isolation. Each subset of projections 302 is associated with a single cavity 308.

Figure 8:
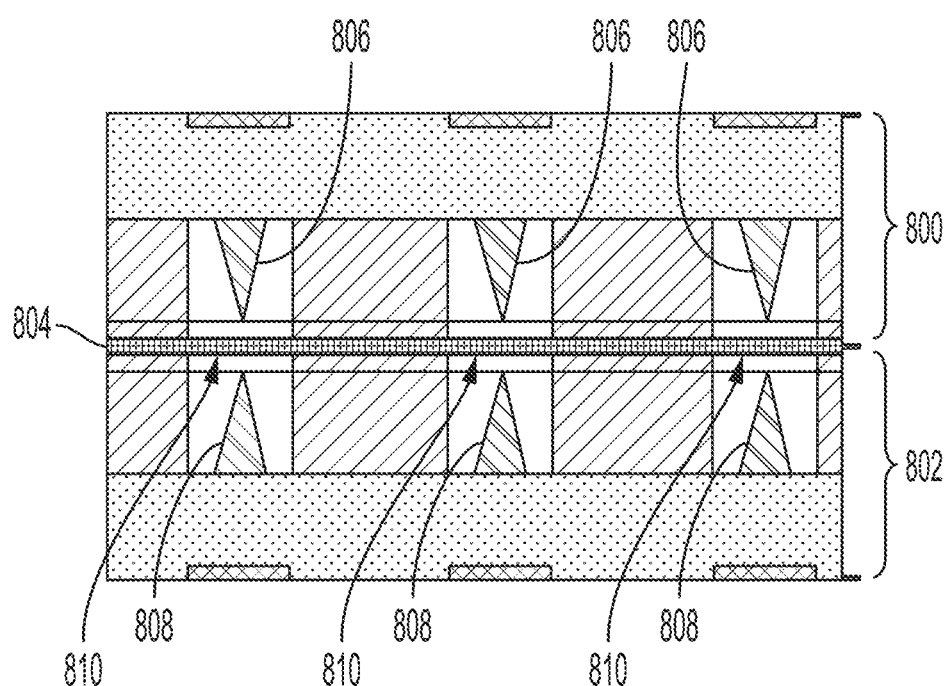
FIG. 8 is a schematic diagram, in cross-section, of two instances of the example quantum control device of FIG. 3A, but in which the instances face each other and share a field-responsive layer in common.

The quantum control devices described herein may be configured such that each target region receives an electric field from two, opposing projections. Such a configuration may increase an electric-field magnitude experienced by each target region and may also improve a uniformity of the electric field within each target region (e.g., in-plane). FIG. 8 presents a schematic diagram of two instances 800, 802 of the example quantum control device 300 of FIG. 3A, but in which the instances face each other and share a field-responsive layer 804 in common. Opposing pairs of projections 806, 808 are aligned to generate corresponding electric fields, each received by a target region 810 shared in common.

In some implementations, the example quantum control device 300 is configured to operate in a cryogenic environment. For example, the example quantum control device 300 may be disposed within a cryostat. The cryogenic environment may have any temperature below about 123 K (e.g., 77 K, 4 K, less than 1 K, etc.). In some implementations, the example quantum control device 300 is configured to operate in a vacuum environment. For example, the example quantum control device 300 may be disposed in a sealable vacuum chamber coupled to one or more vacuum pumps (e.g., rotary vane pumps, turbomolecular pumps, cryogenic pumps, etc.). The vacuum environment may be any partial pressure of gas below $10^{-1}$ torr (e.g., $10^{-3}$ torr, $10^{-6}$ torr, $10^{-9}$ torr, etc.). In some implementations, the example quantum control device 300 is configured to operate in a magnetic field (i.e., B). For example, the example quantum control device may be disposed in a magnetic field of a superconducting coil. The magnetic field may be an applied magnetic field greater than 10 mT. In some variations, the applied magnetic field is greater than 100 mT (e.g., 300 mT). In some variations, the applied magnetic field is greater than 500 mT (e.g., 1 T, 3 T, 4 T, etc.).

A quantum control method may be used to operate the quantum control device 300 described in relation to FIGS. 3A-8. The quantum control method includes generating one or more electric fields from an array of projections on a substrate. Each electrical field is generated by one or more projections extending from the substrate into a respective cavity of an insulator layer. The respective cavity is part of an array of cavities defined by the insulator layer, and the insulator layer is disposed over the substrate and below a field-responsive layer.

The quantum control method also includes receiving the one or more electric fields at respective target regions in the field-responsive layer. The respective target regions are part of an array of target regions in the field-responsive layer, each target region of which, has a quantum state and is aligned with a corresponding cavity in the array of cavities. The method additionally includes controlling the one or more electric fields to cause a first quantum state of a first target region to interact with at least a second quantum state of a second target region.

In some implementations, generating the one or more electric fields includes concentrating the one or more electric fields with respective tips of the one or more projections associated with each electric field. In these implementations, receiving the one or more electric fields at respective target regions includes receiving the one or more electric fields at their respective target regions after concentration. The one or more electric fields after concentration may each have a magnitude of at least $1 \times 10^5$ V/m. In some instances, the one or more electric fields after concentration may each have a magnitude of at least $1 \times 10^9$ V/m. In some instances, the one or more electric fields after concentration may each have a magnitude of at least $1 \times 10^{10}$ V/m. In some instances, one or more electric fields after concentration may each have a magnitude of at least $1\times10^{11}$ V/m. In some instances, the one or more electric fields after concentration may each have a magnitude of at least $1\times10^{12}$ V/m.

In some implementations, receiving the one or more electric fields includes establishing discrete energy levels in a quantum state for at least one of the respective target regions. In some instances, all of the respective target regions have quantum states with discrete energy levels. In some instances, the discrete energy levels include electron energy levels. In some instances, the discrete energy levels include photon energy levels.

In some implementations, controlling the one or more electric fields includes altering a quantum coupling between the first quantum state of the first target region and the second quantum state of the second target region. In some implementations, the first target region neighbors the second target region. In some implementations, a distance between neighboring target regions is less than or equal to 700 nm.

In some implementations, each projection of the array of projections terminates at a tip that resides in a cavity less than 100 nm from a target region associated with the cavity. In some implementations, each projection of the array of projections terminates at a tip that resides in a cavity less than 20 nm from a target region associated with the cavity. In some implementations, each projection of the array of projections terminates at a tip that resides in a cavity less than 15 nm from a target region associated with the cavity. In some implementations, each projection of the array of projections terminates at a tip that resides in a cavity less than 10 nm from a target region associated with the cavity. In some implementations, each projection of the array of projections terminates at a tip that resides in a cavity less than 5 nm from a target region associated with the cavity. In some implementations, each projection of the array of projections terminates at a tip that resides in a cavity less than 1 nm from a target region associated with the cavity.

In some implementations, each projection of the array of projections is formed of a material having a work function at least 4.0 eV. In some implementations, each projection of the array of projections is formed of a material having a work function at least 4.2 eV. In some implementations, each projection of the array of projections is formed of a material having a work function at least 4.4 eV. In some implementations, each projection of the array of projections is formed of a material having a work function at least 4.6 eV. In some implementations, each projection of the array of projections is formed of a material having a work function at least 4.8 eV. In some implementations, each projection of the array of projections is formed of a material having a work function at least 5.0 eV. In some implementations, each projection of the array of projections has a height-to-width ratio in the range of 2:1 to 10000:1. In some implementations, each projection of the array of projections has a height-to-width ratio in a range of 20:1 to 200:1.

In some implementations, at least one target region includes an inclusion in an atomic structure of the field-responsive layer. In some implementations, each target region includes an inclusion in an atomic structure of the field-responsive layer. In these implementations, the inclusions collectively define an array of inclusions aligned with the array of target regions. In some implementations, at least one target region includes a substitution in an atomic structure of the field-responsive layer. In some implementations, each target region includes a substitution in an atomic structure of the field-responsive layer. In these implementations, the substitutions collectively define an array of substitutions aligned with the array of target regions. In some implementations, at least one target region comprises a vacancy in an atomic structure of the field-responsive layer. In some implementations, each target region comprises a vacancy in an atomic structure of the field-responsive layer. In these implementations, the vacancies collectively define an array of vacancies aligned with the array of target regions.

In some implementations, at least one target region comprises an atom or molecule on a surface of the field-responsive layer. The atom or molecule may be disposed on an exterior surface of the field-responsive layer. The atom or molecule may also be disposed on an interior surface of the field-responsive layer. In some instances, both the exterior and interior surfaces of the field-responsive layer have an atom or molecule disposed thereon. In some implementations, each target region comprises an atom or molecule on a surface of the field-responsive layer. In these implementations, the atoms or molecules collectively define an array of atoms or molecules aligned with the array of target regions.

A quantum control device may also be described by the following examples:

Example 1. A quantum control device comprising:
  a substrate comprising a substrate surface;
  an insulator layer over the substrate surface and defining a cavity, the insulator layer comprising an insulator surface that defines an opening to the cavity;
  a field-responsive layer over the insulator surface and comprising a target region that resides over the opening to the cavity; and
  a projection that extends from the substrate into the cavity and terminates at a tip, the projection configured to produce an electric field that interacts with a quantum state in the target region, the tip residing in the cavity and configured to concentrate the electric field produced by the projection.

Example 2. The quantum control device of example 1, wherein the tip resides in the cavity less than 100 nm from the target region.

Example 3. The quantum control device of example 1, wherein the tip resides in the cavity less than 20 nm from the target region.

Example 4. The quantum control device of example 1 or any of examples 2-3, wherein the projection is formed of a material having a work function of at least 4.0 eV.

Example 5. The quantum control device of example 1 or any of examples 2-4, wherein the projection has a height-to-width ratio in a range of 2:1 to 10000:1.

Example 6. The quantum control device of example 1 or any of examples 2-5, wherein the tip of the projection is configured to concentrate the electric field to a magnitude of at least $1\times10^{5}$ V/m in the target region.

Example 7. The quantum control device of example 1 or any of examples 2-5, wherein the tip of the projection is configured to concentrate the electric field to a magnitude of at least $1\times10^{9}$ V/m in the target region.

Example 8. The quantum control device of example 1 or any of examples 2-7, wherein the substrate, the insulator layer and the field-responsive layer define an enclosed space in the cavity, the enclosed space comprising a first clearance volume between the projection and the insulator layer.

Example 9. The quantum control device of example 8, wherein the enclosed space comprises a second clearance volume between the projection and the field-responsive layer.

Example 10. The quantum control device of example 8 or 9, wherein the enclosed space contains a vacuum pressure no greater than $10^{-5}$ Torr.

Example 11. The quantum control device of example 8 or any of examples 9-10, wherein the enclosed space is filled at least partially with a dielectric material.

Example 12. The quantum control device of example 1 or any of examples 2-11, wherein the substrate surface and the insulator surface are planar surfaces.

Example 13. The quantum control device of example 1 or any of examples 2-12, wherein the tip of the projection has a conical shape.

Example 14. The quantum control device of example 1 or any of examples 2-13, wherein the tip of the projection comprises a textured surface.

Example 15. The quantum control device of example 1 or any of examples 2-14, wherein the tip of the projection comprises a nanoparticle.

Example 16. The quantum control device of example 1 or any of examples 2-15, wherein the tip of the projection comprises a coated outer surface.

Example 17. The quantum control device of example 1 or any of examples 2-16, wherein the target region comprises an inclusion in an atomic structure of the field-responsive layer.

Example 18. The quantum control device of example 1 or any of examples 2-17, wherein the target region comprises a substitution in an atomic structure of the field-responsive layer.

Example 19. The quantum control device of example 1 or any of examples 2-18, wherein the target region comprises a vacancy in an atomic structure of the field-responsive layer.

Example 20. The quantum control device of example 1 or any of examples 2-19, wherein the target region comprises an atom or molecule on a surface of the field-responsive layer.

Example 21. The quantum control device of example 20, wherein the atom or molecule is disposed on an exterior surface of the field-responsive layer.

Example 22. The quantum control device of example 20, wherein the atom or molecule is disposed on an interior surface of the field-responsive layer.

Example 23. The quantum control device of example 1 or any of examples 2-22, wherein the field-responsive layer is a patterned layer.

Example 24. The quantum control device of example 23, wherein the patterned layer is formed of two or more materials.

Example 25. The quantum control device of example 1 or any of examples 2-22, wherein the field-responsive layer comprises a plurality of layers.

Example 26. The quantum control device of example 25, wherein the plurality of layers comprises a patterned layer.

Example 27. The quantum control device of example 25 or 26, wherein the plurality of layers comprises:
a target layer containing the target region; and
an intermediate layer disposed between the insulator layer and the target layer;
wherein a thickness of the intermediate layer is part of a distance between the tip of the projection and the target region of the field-responsive layer.

Example 28. The quantum control device of example 27, wherein the distance is less than 100 nm.

Example 29. The quantum control device of example 27, wherein the distance is less than 20 nm.

Example 30. The quantum control device of example 1 or any of examples 2-29, wherein the field-responsive layer comprises a layer of graphene.

Example 31. The quantum control device of example 1 or any of examples 2-30, comprising a plurality of projections, each extending from the substrate into the cavity and terminating at a tip.

Example 32. The quantum control device of example 1 or any of examples 2-31, wherein the substrate and the projection (or the plurality of projections) are formed of different materials.

Example 33. The quantum control device of example 1 or any of examples 2-31, wherein the projection (or the plurality of projections) is part of the substrate.

Example 34. The quantum control device of example 1 or any of examples 2-33, wherein the insulator layer comprises:
a first insulator layer over the substrate surface; and
a second insulator layer between the first insulator layer and the field-responsive layer.

Example 35. The quantum control device of example 1 or any of examples 2-34, comprising a second insulator layer over the field-responsive layer.

Example 36. The quantum control device of example 35, wherein the second insulator layer comprises a hole opposite the opening of the cavity.

Example 37. The quantum control device of example 35 or 36, comprising a conductive layer over the second insulator layer.

Example 38. The quantum control device of example 1 or any of examples 2-37, comprising:
an addressing layer below the substrate that comprises an electrical contact opposite a base of the projection.

Example 39. The quantum control device of example 38, wherein the electrical contact is configured to deliver a voltage to the substrate, and the substrate is configured to transfer the voltage to the projection to produce the electric field.

Example 40. The quantum control device of example 38 or 39, wherein the electrical contact is configured to receive an electrical signal from the substrate, the electrical signal characterizing the quantum state of the target region, the substrate configured to transfer the electrical signal from the projection to the electrical contact.

Example 41. The quantum control device of example 1 or any of examples 2-40, wherein the insulator layer comprises an interior sidewall surrounding the projection that defines at least a portion of the cavity.

Example 42. The quantum control device of example 41, wherein the interior sidewall meets the insulator surface at the opening to the cavity.

Example 43. The quantum control device of example 41 or 42, wherein:
the opening is a first opening of the cavity and the insulator surface is a first insulator surface of the insulator layer;
the insulator layer comprises a second insulator surface coupled to the substrate surface and opposite the first insulator surface;
the interior sidewall extends through a thickness of the insulator layer and meets the second insulator surface at a second opening of the cavity;
the projection extends from the substrate through the second opening of the cavity; and
the projection extends to a height from the substrate that is less than the thickness of the insulator layer.

Example 44. The quantum control device of example 43, wherein the substrate surface, the first insulator surface, and the second insulator surface are planar surfaces.

Example 45. The quantum control device of example 1 or any of examples 2-44,
wherein the substrate surface is a first substrate surface and the substrate comprises:
a second substrate surface opposite the first substrate surface; and
an optical focusing structure formed on the second substrate surface opposite a base of the projection, the optical focusing structure configured to guide light to the projection.

Example 46. The quantum control device of example 45, wherein the optical focusing structure is a diffractive pattern formed on the second substrate surface.

Example 47. The quantum control device of example 45, wherein the optical focusing structure is a lens formed on the second substrate surface.

Example 48. The quantum control device of example 45, wherein the first substrate surface, the second substrate surface, and the insulator surface are planar surfaces.

Example 49. The quantum control device of example 1 or any of examples 2-48, comprising:
a laser configured to direct a beam of light onto the target region; and
an electron spectrometer configured to receive electrons emitted from the target region in response to receiving the beam of light.

Example 50. The quantum control device of example 49, comprising an optical spectrometer configured to receive photons from the target region.

Example 51. The quantum control device of example 1 or any of examples 2-50, comprising:
an optical waveguide defined by the insulator layer, the field-responsive layer, the cavity, or any combination thereof; and
wherein the optical waveguide is configured to propagate photons that couple to the quantum state of the target region.

A quantum control method may also be described by the following examples:

Example 52. A quantum control method comprising:
generating an electric field from a projection on a substrate, the projection extending from a substrate surface of the substrate into a cavity defined by an insulator layer, the insulator layer disposed over the substrate surface and comprising an insulator surface that defines an opening to the cavity;
receiving the electric field at a target region of a field-responsive layer, the field-responsive layer disposed over the insulating layer, the target region residing over the opening of the cavity; and controlling the electric field to interact with a quantum state in the target region of the field-responsive layer.

Example 53. The quantum control method of example 52, comprising:
wherein generating the electric field at the projection comprises concentrating the electric field with a tip of the projection; and
wherein receiving the electric field at the target region comprises receiving the concentrated electric field at the target region.

Example 54. The quantum control method of example 53, wherein the concentrated electric field has a magnitude of at least $1 \times 10^5$ V/m.

Example 55. The quantum control method of example 53, wherein the concentrated electric field has a magnitude of at least $1 \times 10^9$ V/m in the target region.

Example 56. The quantum control method of example 52 or any of examples 53-55, wherein generating the electric field from the projection comprises:
applying a voltage to an electrical contact below the substrate and opposite a base of the projection; and
transferring the voltage through the substrate to the projection.

Example 57. The quantum control method of example 52 or any of examples 53-56, comprising:
transferring an electrical signal from the projection to an electrical contact below the substrate and opposite a base of the projection, the electrical signal characterizing the quantum state of the target region.

Example 58. The quantum control method of example 52 or any of examples 53-57,
wherein the substrate surface is a first substrate surface and the substrate comprises a second substrate surface opposite the first substrate surface; and
wherein generating the electric field from the projection comprises:
receiving a beam of light at an optical focusing structure opposite a base of the projection, the optical focusing structure formed on the second substrate surface; and
guiding light to the projection with the optical focusing structure.

Example 59. The quantum control method of example 52 or any of examples 53-58, comprising:
receiving a beam of light at the target region of the field-responsive layer.

Example 60. The quantum control method of example 59, comprising:
receiving, at an electron spectrometer, electrons emitted from the target region in response to the beam of light.

Example 61. The quantum control method of example 52 or any of examples 53-60, wherein controlling the electric field to interact with the quantum state comprises altering a magnitude of the electric field to alter the quantum state in the target region of the field-responsive layer.

Example 62. The quantum control method of example 52 or any of examples 53-61, comprising:
while generating the electric field, transferring an electron from the projection to the target region of the field-responsive layer.

Example 63. The quantum control method of example 52 or any of examples 53-62, wherein the tip resides in the cavity less than 100 nm from the target region.

Example 64. The quantum control method of example 52 or any of examples 53-62, wherein the tip resides in the cavity less than 20 nm from the target region.

Example 65. The quantum control method of example 52 or any of examples 53-64, wherein the projection is formed of a material having a work function at least 4.0 eV.

Example 66. The quantum control method of example 52 or any of examples 53-65, wherein the projection has a height-to-width ratio in a range of 2:1 to 10000:1.

Example 67. The quantum control method of example 52 or any of examples 53-66, wherein the target region comprises an inclusion in an atomic structure of the field-responsive layer.

Example 68. The quantum control method of example 52 or any of examples 53-67, wherein the target region comprises a substitution in an atomic structure of the field-responsive layer.

Example 69. The quantum control method of example 52 or any of examples 53-68, wherein the target region comprises a vacancy in an atomic structure of the field-responsive layer.

Example 70. The quantum control method of example 52 or any of examples 53-69, wherein the target region comprises an atom or molecule on a surface of the field-responsive layer.

Example 71. The quantum control method of example 70, wherein the atom or molecule is disposed on an exterior surface of the field-responsive layer.

Example 72. The quantum control method of example 70, wherein the atom or molecule is disposed on an interior surface of the field-responsive layer.

Example 73. The quantum control method of example 52 or any of examples 53-79, comprising:
propagating photons in an optical waveguide defined by the insulator layer, the field-responsive layer, the cavity, or any combination thereof; and
coupling the photons to the quantum state of the target region.

A quantum control device including an array of projections may also be described by the following examples:

Example 74. A quantum control device comprising:
a substrate;
an insulator layer that defines an array of cavities;
a field-responsive layer over the insulator layer and comprising an array of target regions, each aligned with a corresponding cavity; and
projections extending from the substrate into respective cavities, each projection configured to produce an electric field that:
interacts with a quantum state of a target region adjacent the projection, and
controls quantum coupling between the quantum state of the target region and a quantum state of a neighboring target region.

Example 75. The quantum control device of example 74, wherein a distance between neighboring target regions is less than or equal to 700 nm.

Example 76. The quantum control device of example 74 or 75, wherein at least one projection comprises a subset of projections, each producing a respective electric field that defines part of the electric field.

Example 77. The quantum control device of example 74 or any of examples 75-76, wherein each projection terminates at a tip that resides in the respective cavity less than 100 nm from the adjacent target region.

Example 78. The quantum control device of example 74 or any of examples 75-76, wherein each projection terminates at a tip that resides in the respective cavity less than 20 nm from the adjacent target region.

Example 79. The quantum control device of example 74 or any of examples 75-78, wherein each projection is formed of a material having a work function at least 4.0 eV.

Example 80. The quantum control device of example 74 or any of examples 75-79, wherein each projection has a height-to-width ratio in the range of 2:1 to 10000:1.

Example 81. The quantum-control device of example 74 or any of examples 75-80, wherein each projection terminates in a tip configured to concentrate the electric field produced by the projection.

Example 82. The quantum control device of example 81, wherein the tip concentrates the electric field to a magnitude of at least $1\times10^5$ V/m in the target region adjacent the projection.

Example 83. The quantum control device of example 81, wherein the tip concentrates the electric field to a magnitude of at least $1\times10^9$ V/m in the target region adjacent the projection.

Example 84. The quantum control device of example 74 or any of examples 75-83, wherein the substrate, the insulator layer and the field-responsive layer define an enclosed space in each cavity, the enclosed space comprising a first clearance volume between a respective projection and the insulator layer.

Example 85. The quantum control device of example 84, wherein the enclosed space comprises a second clearance volume between a tip of the respective projection and the field-responsive layer.

Example 86. The quantum control device of example 84 or 85, wherein the enclosed space contains a vacuum pressure no greater than $10^{-5}$ Torr.

Example 87. The quantum control device of example 84 or any of examples 85-86, wherein the enclosed space is filled at least partially with a dielectric material.

Example 88. The quantum control device of example 74 or any of examples 75-87, wherein at least one target region comprises an inclusion in an atomic structure of the field-responsive layer.

Example 89. The quantum control device of example 74 or any of examples 75-87, wherein each target region comprises an inclusion in an atomic structure of the field-responsive layer, the inclusions collectively defining an array of inclusions aligned with the array of target regions.

Example 90. The quantum control device of example 74 or any of examples 75-89, wherein at least one target region comprises a substitution in an atomic structure of the field-responsive layer.

Example 91. The quantum control device of example 74 or any of examples 75-89, wherein each target region comprises a substitution in an atomic structure of the field-responsive layer, the substitutions collectively defining an array of substitutions aligned with the array of target regions.

Example 92. The quantum control device of example 74 or any of examples 75-91, wherein at least one target region comprises a vacancy in an atomic structure of the field-responsive layer.

Example 93. The quantum control device of example 74 or any of examples 75-91, wherein each target region comprises a vacancy in an atomic structure of the field-responsive layer, the vacancies collectively defining an array of vacancies aligned with the array of target regions.

Example 94. The quantum control device of example 74 or any of examples 75-93, wherein at least one target region comprises an atom or molecule on a surface of the field-responsive layer.

Example 95. The quantum control device of example 94, wherein the atom or molecule is disposed on an exterior surface of the field-responsive layer.

Example 96. The quantum control device of example 94, wherein the atom or molecule is disposed on an interior surface of the field-responsive layer.

Example 97. The quantum control device of example 74 or any of examples 75-93, wherein each target region comprises an atom or molecule on a surface of the field-responsive layer, the atoms or molecules collectively defining an array of atoms or molecules aligned with the array of target regions.

Example 98. The quantum control device of example 74 or any of examples 75-97, wherein the field-responsive layer comprises a layer of graphene.

Example 99. The quantum control device of example 74 or any of examples 75-98, comprising:
an addressing layer below the substrate comprising electrical contacts configured to receive voltage signals, each electrical contact aligned with a respective projection.

Example 100. The quantum control device of example 99, wherein each electrical contact is configured to deliver a respective voltage signal to the substrate independent of the other electrical contacts, the substrate configured to transfer the respective voltage signal to a projection aligned with the electrical contact to produce a respective electric field.

Example 101. The quantum control device of example 99 or 98, wherein each electrical contact is configured to receive an electrical signal from the substrate independent of the other electrical contacts, the electrical signal characterizing a quantum state of a target region adjacent a projection aligned with the electrical contact, the substrate configured to transfer the electrical signal from the aligned projection to the electrical contact.

Example 102. The quantum control device of example 74 or any of examples 75-101,
wherein at least one projection comprises a subset of projections (or the subset of projections of example 76); and
wherein the quantum control device comprises an addressing layer below the substrate that comprises a plurality of electrical contacts, each aligned with a respective subset of projections and configured to receive a voltage signal for the respective subset of projections.

Example 103. The quantum control device of example 102, wherein each electrical contact is configured to deliver a respective voltage signal to the substrate independent of the other electrical contacts, the substrate configured to transfer the respective voltage signal to a subset of projections aligned with the electrical contact to produce a respective electric field (or the respective electric field of example 76).

Example 104. The quantum control device of example 74 or any of examples 75-103, comprising:
a laser system configured to direct a laser signal to the array of target regions; and
an electron spectrometer configured to receive electrons emitted from the array of target regions in response to the laser signal.

Example 105. The quantum control device of example 74 or any of examples 75-104, comprising:
an array of optical focusing structures below the substrate, each aligned opposite a respective cavity and configured to guide light to a projection associated with the respective cavity.

Example 106. The quantum control device of example 74 or any of examples 75-105, comprising:
a conductive layer comprising voids arranged along a periodic lattice, the periodic lattice having first sites occupied by voids and second sites not occupied by voids, the second sites aligned opposite the array of cavities.

Example 107. The quantum control device of example 106, wherein the conductive layer is below the substrate.

Example 108. The quantum control device of example 106, wherein the conductive layer is over the field-responsive layer.

Example 109. The quantum control device of example 74 or any of examples 75-108, comprising a plurality of trenches formed into the substrate and arranged to isolate individual projections extending from the substrate.

Example 110. The quantum control device of example 74 or any of examples 75-108, comprising a plurality of trenches formed into the substrate and arranged to isolate a subset of projections extending from the substrate (or the subset of projections of examples 76 or 102), each subset associated with a single cavity.

Example 111. The quantum control device of example 74 or any of examples 75-110, comprising:
an optical waveguide defined by the insulator layer, the field-responsive layer, one or more cavities, or any combination thereof; and
wherein the optical waveguide is associated with at least one target region and is configured to propagate photons that couple to a quantum state of the at least one target region.

A quantum control method based on an array of projections may also be described by the following examples:

Example 112. A quantum control method, the method comprising:
generating one or more electric fields from an array of projections on a substrate, each electrical field generated by one or more projections extending from the substrate into a respective cavity of an insulator layer, the respective cavity part of an array of cavities defined by the insulator layer, the insulator layer disposed over the substrate and below a field-responsive layer;
receiving the one or more electric fields at respective target regions in the field-responsive layer, the respective target regions part of an array of target regions in the field-responsive layer, each target region of which, has a quantum state and is aligned with a corresponding cavity in the array of cavities; and controlling the one or more electric fields to cause a first quantum state of a first target region to interact with at least a second quantum state of a second target region.

Example 113. The quantum control method of example 112, wherein receiving the one or more electric fields comprises establishing discrete energy levels in a quantum state for at least one of the respective target regions.

Example 114. The quantum control method of example 113, wherein all of the respective target regions have quantum states with discrete energy levels.

Example 115. The quantum control method of example 113 or 114, wherein the discrete energy levels comprise electron energy levels.

Example 116. The quantum control method of example 113 or any of examples 114-115, wherein the discrete energy levels comprise photon energy levels.

Example 117. The quantum control method of example 112, wherein controlling the one or more electric fields comprises altering a quantum coupling between the first quantum state of the first target region and the second quantum state of the second target region Example 118. The quantum control method of example 112 or any of examples 113-117, wherein the first target region neighbors the second target region.

Example 119. The quantum control method of example 112 or any of examples 113-118, wherein a distance between neighboring target regions is less than or equal to 700 nm.

Example 120. The quantum control method of example 112 or any of examples 113-119, wherein each projection of the array of projections terminates at a tip that resides in a cavity less than 100 nm from a target region associated with the cavity.

Example 121. The quantum control method of example 112 or any of examples 113-119, wherein each projection of the array of projections terminates at a tip that resides in a cavity less than 20 nm from a target region associated with the cavity.

Example 122. The quantum control method of example 112 or any of examples 113-121, wherein each projection of the array of projections is formed of a material having a work function at least 4.0 eV.

Example 123. The quantum control method of example 112 or any of examples 113-122, wherein each projection of the array of projections has a height-to-width ratio in the range of 2:1 to 10000:1.

Example 124. The quantum control method of example 112 or any of examples 113-123, wherein at least one target region comprises an inclusion in an atomic structure of the field-responsive layer.

Example 125. The quantum control method of example 112 or any of examples 113-123, wherein each target region comprises an inclusion in an atomic structure of the field-responsive layer, the inclusions collectively defining an array of inclusions aligned with the array of target regions.

Example 126. The quantum control method of example 112 or any of examples 113-125, wherein at least one target region comprises a substitution in an atomic structure of the field-responsive layer.

Example 127. The quantum control method of example 112 or any of examples 113-125, wherein each target region comprises a substitution in an atomic structure of the field-responsive layer, the substitutions collectively defining an array of substitutions aligned with the array of target regions.

Example 128. The quantum control method of example 112 or any of examples 113-127, wherein at least one target region comprises a vacancy in an atomic structure of the field-responsive layer.

Example 129. The quantum control method of example 112 or any of examples 113-127, wherein each target region comprises a vacancy in an atomic structure of the field-responsive layer, the vacancies collectively defining an array of vacancies aligned with the array of target regions.

Example 130. The quantum control method of example 112 or any of examples 113-129, wherein at least one target region comprises an atom or molecule on a surface of the field-responsive layer.

Example 131. The quantum control method of example 130, wherein the atom or molecule is disposed on an exterior surface of the field-responsive layer.

Example 132. The quantum control method of example 130, wherein the atom or molecule is disposed on an interior surface of the field-responsive layer.

Example 133. The quantum control method of example 112 or any of examples 113-130, wherein each target region comprises an atom or molecule on a surface of the field-responsive layer, the atoms or molecules collectively defining an array of atoms or molecules aligned with the array of target regions.

Example 134. The quantum control method of example 112 or any of examples 113-133, comprising:

propagating photons in an optical waveguide defined by the insulator layer, the field-responsive layer, a cavity of the array of cavities, or any combination thereof; and coupling the photons to a quantum state of at least one target region of the array of target regions.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A quantum control device comprising:
   a substrate comprising a substrate surface;
   an insulator layer over the substrate surface and defining a cavity, the insulator layer comprising an insulator surface that defines an opening to the cavity;
   a field-responsive layer over the insulator surface and comprising a target region that resides over the opening to the cavity; and
   a projection that extends from the substrate into the cavity and terminates at a tip, the projection configured to produce an electric field that interacts with a quantum state in the target region, the tip residing in the cavity and configured to concentrate the electric field produced by the projection.

2. The quantum control device of claim 1, wherein the tip resides in the cavity less than 100 nm from the target region.

3. The quantum control device of claim 1, wherein the projection has a height-to-width ratio in a range of 2:1 to 10000:1.

4. The quantum control device of claim 1, wherein the tip of the projection is configured to concentrate the electric field to a magnitude of at least $1 \times 10^9$ V/m in the target region.

5. The quantum control device of claim 1, wherein the field-responsive layer comprises a plurality of layers.

6. The quantum control device of claim 5, wherein the plurality of layers comprises:
   a target layer containing the target region; and
   an intermediate layer disposed between the insulator layer and the target layer;
   wherein a thickness of the intermediate layer is part of a distance between the tip of the projection and the target region of the field-responsive layer.

7. The quantum control device of claim 1, comprising:
an addressing layer below the substrate that comprises an electrical contact opposite a base of the projection.

8. The quantum control device of claim 7, wherein the electrical contact is configured to receive an electrical signal from the substrate, the electrical signal characterizing the quantum state of the target region, the substrate configured to transfer the electrical signal from the projection to the electrical contact.

9. The quantum control device of claim 1, comprising:
a laser configured to direct a beam of light onto the target region; and
an electron spectrometer configured to receive electrons emitted from the target region in response to receiving the beam of light.

10. The quantum control device of claim 9, comprising an optical spectrometer configured to receive photons from the target region.

11. The quantum control device of claim 1, comprising:
an optical waveguide defined by the insulator layer, the field-responsive layer, the cavity, or any combination thereof;
wherein the optical waveguide is configured to propagate photons that couple to the quantum state of the target region.

12. A quantum control method comprising:
generating an electric field from a projection on a substrate, the projection extending from a substrate surface of the substrate into a cavity defined by an insulator layer, the insulator layer disposed over the substrate surface and comprising an insulator surface that defines an opening to the cavity;
receiving the electric field at a target region of a field-responsive layer, the field-responsive layer disposed over the insulating layer, the target region residing over the opening of the cavity; and
controlling the electric field to interact with a quantum state in the target region of the field-responsive layer.

13. The quantum control method of claim 12, comprising:
wherein generating the electric field at the projection comprises concentrating the electric field with a tip of the projection; and
wherein receiving the electric field at the target region comprises receiving the concentrated electric field at the target region.

14. The quantum control method of claim 13, wherein the concentrated electric field has a magnitude of at least $1 \times 10^9$ V/m in the target region.

15. The quantum control method of claim 12, comprising:
transferring an electrical signal from the projection to an electrical contact below the substrate and opposite a base of the projection, the electrical signal characterizing the quantum state of the target region.

16. The quantum control method of claim 12, comprising:
receiving a beam of light at the target region of the field-responsive layer.

17. The quantum control method of claim 16, comprising:
receiving, at an electron spectrometer, electrons emitted from the target region in response to the beam of light.

18. The quantum control method of claim 12, wherein controlling the electric field to interact with the quantum state comprises altering a magnitude of the electric field to alter the quantum state in the target region of the field-responsive layer.

19. The quantum control method of claim 12, comprising:
while generating the electric field, transferring an electron from the projection to the target region of the field-responsive layer.

20. The quantum control method of claim 12,
wherein the projection terminates at a tip; and
wherein the tip resides in the cavity less than 100 nm from the target region.

21. The quantum control method of claim 12, wherein the projection has a height-to-width ratio in a range of 2:1 to 10000:1.

* * * * *